(12) United States Patent
Fiedler

(10) Patent No.: US 9,310,830 B2
(45) Date of Patent: *Apr. 12, 2016

(54) HIGH-SPEED I/O DATA SYSTEM

(71) Applicant: Microsoft Technology Licensing, LLC, Redmond, WA (US)

(72) Inventor: Alan S. Fiedler, Mountain View, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/471,398

(22) Filed: Aug. 28, 2014

(65) Prior Publication Data

US 2014/0372785 A1  Dec. 18, 2014

Related U.S. Application Data

(63) Continuation of application No. 13/170,444, filed on Jun. 28, 2011, now Pat. No. 8,832,487.

(51) Int. Cl.
*G06F 1/08* (2006.01)
*G06F 1/10* (2006.01)
*H03L 7/00* (2006.01)

(52) U.S. Cl.
CPC .. *G06F 1/08* (2013.01); *G06F 1/10* (2013.01); *H03L 7/00* (2013.01)

(58) Field of Classification Search
CPC ................ G06F 1/08; G06F 1/10; H03L 7/00
See application file for complete search history.

(56) References Cited

U.S. PATENT DOCUMENTS

| | | | |
|---|---|---|---|
| 4,742,532 A | 5/1988 | Walker | |
| 5,572,721 A | 11/1996 | Rostamian et al. | |
| 5,805,089 A | 9/1998 | Fiedler et al. | |
| 5,939,929 A | 8/1999 | Tsinker | |
| 6,078,514 A | 6/2000 | Takemae et al. | |
| 6,085,257 A | 7/2000 | Ducaroir et al. | |
| 6,400,616 B1 | 6/2002 | Tamura et al. | |
| 6,490,628 B2 | 12/2002 | Hindie et al. | |

(Continued)

OTHER PUBLICATIONS

"Ex Parte Quayle Action", U.S. Appl. No. 13/170,585, Oct. 12, 2012, 7 pages.

(Continued)

*Primary Examiner* — Thuan Du
(74) *Attorney, Agent, or Firm* — Gregg Wisdom; Judy Yee; Mickey Minhas

(57) ABSTRACT

In embodiments of a high-speed I/O data system, a first computer chip includes a data transmission system, and a second computer chip includes a data reception system. A data channel communicates an NRZ data signal, and a clock channel communicates a forwarded clock signal, from the data transmission system to the data reception system. The data transmission system includes a first differential serializing transmitter to generate the NRZ data signal from pulsed data, and further includes a second differential serializing transmitter to generate a forwarded clock signal. A first multi-phase transmit clock generator generates transmit clock signals for the first and second differential serializing transmitters. The data reception system includes a data receiver and a de-serializer to receive and de-serialize the NRZ data signal, and includes a multi-phase receive clock generator to generate receive clock signals from the forwarded clock signal for the de-serializing data receiver.

20 Claims, 18 Drawing Sheets

(56) References Cited

U.S. PATENT DOCUMENTS

| | | | |
|---|---|---|---|
| 6,677,793 | B1 | 1/2004 | Chan et al. |
| 6,910,092 | B2 | 6/2005 | Calvignac et al. |
| 7,020,729 | B2 | 3/2006 | Taborek, Sr. et al. |
| 7,187,721 | B1 | 3/2007 | Dally et al. |
| 7,571,340 | B2 | 8/2009 | Jiang |
| 7,577,861 | B2 | 8/2009 | Levin et al. |
| 7,587,537 | B1 | 9/2009 | Burney |
| 7,814,250 | B2 | 10/2010 | Bracamontes Del Toro |
| 7,848,367 | B2 | 12/2010 | Hornbuckle et al. |
| 8,415,980 | B2 | 4/2013 | Fiedler |
| 8,527,676 | B2 | 9/2013 | Morrison et al. |
| 8,832,487 | B2 | 9/2014 | Fiedler |
| 2002/0000853 | A1 | 1/2002 | Chen et al. |
| 2007/0156932 | A1 | 7/2007 | Kasahara et al. |
| 2009/0116839 | A1 | 5/2009 | Kikuchi et al. |
| 2010/0076385 | A1 | 3/2010 | Huang et al. |
| 2012/0224613 | A1 | 9/2012 | Loh |
| 2013/0002300 | A1 | 1/2013 | Fiedler |
| 2013/0007500 | A1 | 1/2013 | Fiedler |

OTHER PUBLICATIONS

"Final Office Action", U.S. Appl. No. 13/170,444, Apr. 1, 2014, 6 pages.

"Non-Final Office Action", U.S. Appl. No. 13/170,444, Dec. 20, 2013, 7 pages.

"Notice of Allowance", U.S. Appl. No. 13/170,444, May 2, 2014, 4 pages.

"Notice of Allowance", U.S. Appl. No. 13/170,585, Nov. 26, 2012, 7 pages.

"Stratix II GX Device Data sheet", Altera Corporation, Available at <http://www.altera.com/literature/hb/stx2gx/stxiigx_sii5v1_01.pdf>,Oct. 2007, 316 pages.

"Supplemental Notice of Allowance", U.S. Appl. No. 13/170,585, Mar. 14, 2013, 2 pages.

Fiedler, "High-Speed I/O Data System", U.S. Appl. No. 13/170,444,Jun. 28, 2011, 34 pages.

Fiedler, "Serializing Transmitter", U.S. Appl. No. 13/170,585,Jun. 28, 2011, 21 pages.

Keezer, et al.,' "Low-Cost 20 Gbps Digital Test Signal Synthesis Using SiGe and InP Logic", Journal of Eletronic Testing, vol. 26, Issue 1, Available at <http://www.springerlink.com/content/p249376832175780/>,Jan. 15, 2010, pp. 87-96.

Kim, et al.,' "A 3.4Gbps Transmitter for Multi-Serial Data Communication", In Proceedings of CISST 2010, Available at <http://www.wseas.us/e-library/conferences/2010/Harvard/CISST/CISST-27.pdf,Jan. 2010, pp. 153-156.

Kumar, et al.,' "A Family of 45nm IA Processors", In Proceedings of ISSCC 2009, Available at <http://ieeexplore.ieee.org/xpl/freeabs_all.jsp?reload=true&arnumber=4977306>,Feb. 9, 2009, pp. 58-59.

Young, "Introducing Intel's chip-to-chip optical I/O interconnect technology", Retrieved from: <http://www.deviceforge.com/articles/AT3588366215.html> on Mar. 1, 2011, Apr. 2, 2004, 5 pages.

HIGH-SPEED I/O DATA SYSTEM

RELATED APPLICATION

This application is a continuation of and claims priority to U.S. patent application Ser. No. 13/170,444 filed Jun. 28, 2011 entitled "High-Speed I/O Data System", the disclosure of which is incorporated by reference herein in its entirety.

BACKGROUND

Conventional high-speed I/O data circuits to transfer large volumes of data at high speeds across short distances, such as from chip-to-chip on the same circuit board, are frequently inadequate for the task. The specifications for many industry-standard I/O interfaces were outlined nearly a decade ago, and are general purpose designs that attempt to meet a wide-range of design needs, but are not optimal for any one design. Additionally, implementations of I/O data circuits that utilize packet-based communication have a large memory requirement that may come with a significant latency penalty. Alternatively, attempts at full-custom I/O solutions are often less than optimal due to the improper application of digital design methods, induced power supply noise, and lack of signal integrity control. Chip designers are often faced with the dilemma of system implementation on a single, larger chip having a low yield and a high manufacturing cost with the benefit of faster intra-chip data communication, or system implementation with multiple chips having a higher yield and an overall lower manufacturing cost, but with slower inter-chip data communication.

SUMMARY

This Summary introduces simplified concepts of a high-speed I/O data system implemented with serializing transmitters, and the concepts are further described below in the Detailed Description and/or shown in the Figures. This Summary should not be considered to describe essential features of the claimed subject matter, nor used to determine or limit the scope of the claimed subject matter.

A high-speed I/O data system is described. In embodiments, a first computer chip includes a data transmission system, and a second computer chip includes a data reception system. A data channel communicates an NRZ data signal, and a clock channel communicates a forwarded clock signal, from the data transmission system to the data reception system. The data transmission system includes a first differential serializing transmitter to generate the NRZ data signal from pulsed data, and includes a second differential serializing transmitter to generate a forwarded clock signal. A first multi-phase transmit clock generator generates transmit clock signals for the first and second differential serializing transmitters. The data reception system includes a data receiver and a de-serializer to receive and de-serialize the NRZ data signal, and includes a multi-phase receive clock generator to generate receive clock signals from the forwarded clock signal for the de-serializing data receiver.

In other embodiments, the differential serializing transmitters each include two single-ended serializing transmitters. Each single-ended serializing transmitter includes N (where N is a positive integer) multiplexing drive units that each generate a series of output pulses derived from input data signals and multi-phase clock signals. Each of the multiplexing drive units includes a pulse-controlled push-pull output driver that has first and second inputs, and an output coupled to an output of the multiplexing drive unit. Each of the multiplexing drive units also includes a first M:1 (where M is two or more) pulse-generating multiplexer having an output coupled to the first input of the pulse-controlled push-pull output driver, and generating a first series of intermediate pulses having a first pulse width at the output; and a second M:1 pulse-generating multiplexer having an output coupled to the second input of the pulse-controlled push-pull output driver, and generating a second series of intermediate pulses having a second pulse width at the output.

BRIEF DESCRIPTION OF THE DRAWINGS

Embodiments of a high-speed I/O data system implemented with serializing transmitters are described with reference to the following Figures. The same numbers may be used throughout to reference like features and components that are shown in the Figures.

DETAILED DESCRIPTION

Figure 1:
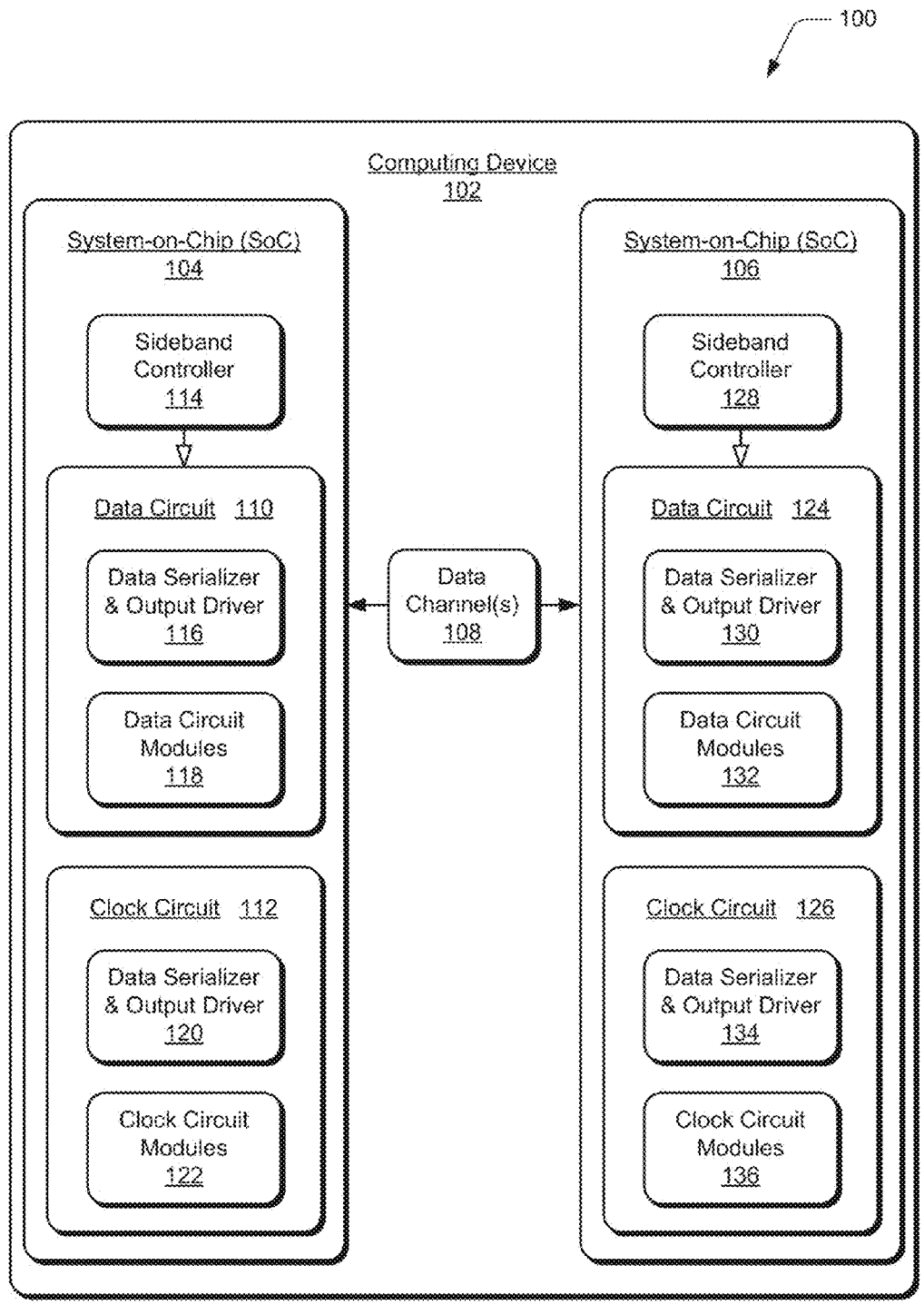
FIG. 1 illustrates an example system in which embodiments of a high-speed I/O data system that includes serializing transmitters can be implemented.

Embodiments of a high-speed I/O data system implemented with serializing transmitters and output drivers are described. The high-speed I/O data system can be implemented for chip-to-chip, chip-to-memory, and chip-to-optical-module NRZ (non-return-to-zero) data communication. The circuit topology of a serializing transmitter provides for low-power, high-speed operation and includes four pulse-toggled 2:1 CMOS multiplexers to form an 8:4 first stage of serialization, followed by a final pulse-controlled 4:1 serializer that is also a push-pull output driver, consuming one-quarter (¼) the power of a comparable parallel-terminated output driver. The first stage uses high-speed, rail-to-rail CMOS logic and consumes no static power, and its topology provides that the magnitude of its power supply current at each bit time is constant and independent of data. The push-pull output driver has a programmable source resistance, and when implemented differentially, consumes constant current when terminated at the receiver, again independent of data. Because of its constant current draw, the power supply bypass capacitance requirements of a serializing transmitter are minimized.

Embodiments of a high-speed I/O data system implemented with serializing transmitters as a chip-to-chip I/O data interface provides approximately an aggregate 40× data rate improvement compared to conventional data interfaces. In implementations, the high-speed I/O data system reduces silicon manufacturing costs with a reduced layout area per pin and a higher per-pin data rate; reduces power-delivery costs with a reduced and constant power supply current; reduces system cooling costs due to lower power; reduces package costs with constant power supply current, fewer IO pins, and fewer power supply domains; and reduces system board costs with fewer traces. The high-speed I/O data system can also increase reliability with an improved timing margin, and improve system performance with reduced latency and increased I/O bandwidth.

In embodiments, a low-cost, area- and power-efficient CMOS serializing transmitter device addresses the need for both high speed and low power, and can be implemented for data communication between chips in the same package, on the same board, and on different boards across a backplane. The CMOS logic provides for superior speed-power ratio across a wide range of data rates, as well as portability across technology nodes, including future nodes that will provide further performance gains and power reduction. In spite of the use of CMOS logic, a serializing transmitter presents a largely constant current load to its power supply. Within the device, parallel signal paths generate multiple streams of data-controlled pulses to control a final 4:1 multiplexer that is also the output driver. The source termination resistance of a serializing transmitter is controlled over process, voltage, and temperature (PVT) to match the resistance of an external reference resistor.

While features and concepts of a high-speed I/O data system implemented with serializing transmitters can be implemented in any number of different devices, systems, environments, and/or configurations, embodiments of a high-speed I/O data system implemented with serializing transmitters are described in the context of the following example devices, systems, and methods.

FIG. 1 illustrates an example system 100 in which various embodiments of a high-speed I/O data system that includes differential serializing transmitters can be implemented. A differential serializing transmitter configured with an output driver is also referred to herein as a data serializer and output driver. The example system includes a computing device 102, which may be any type of electronic and/or computing device, and any combination of a mobile phone, entertainment device, navigation device, gaming device, user device, wireless device, portable device, tablet computer, and the like. Any of the computing devices referred to herein can be implemented with various components, such as one or more processors and memory devices, as well as any number and combination of differing components as further described with reference to the example device shown in FIG. 17.

In the example system 100, the computing device 102 includes a first system-on-chip (SoC) 104 and a second SoC 106 that are configured for chip-to-chip data communication via data channels 108. An SoC, also referred to herein as a "chip" or a "computer chip", can be integrated with various electronic circuitry, a microprocessor, memory, input-output (I/O) logic control, communication interfaces, and components, as well as other hardware, firmware, and/or software to implement a high-speed I/O data system. An SoC also includes an integrated data bus that couples the various components of the chip for data communication between the components. The data bus in an SoC may also be implemented as any one or a combination of different bus structures and/or bus architectures.

In this example, the SoC 104 includes a data circuit 110, a clock circuit 112, and optionally, a sideband controller 114. The data circuit 110 includes a data serializer and output driver 116, as well as additional data circuit modules 118 that are described with reference to FIGS. 2 and 3. The clock circuit 112 also includes a data serializer and output driver 120, as well as additional clock circuit modules 122 that are described with reference to FIGS. 2 and 3. Similarly, the SoC 106 includes a data circuit 124, a clock circuit 126, and optionally, a sideband controller 128. The data circuit 124 includes a data serializer and output driver 130, as well as additional data circuit modules 132 that are described with reference to FIGS. 2 and 3. The clock circuit 126 also includes a data serializer and output driver 134, as well as additional clock circuit modules 136 that are described with reference to FIGS. 2 and 3.

In embodiments, the data serializer and output drivers each include a differential serializing transmitter implemented in each of the data circuits and clock circuits. Each of the data serializer and output drivers is high-performance for faster data communication, low-jitter, low-power, and constant power supply differential data. In embodiments, the data serializer and output drivers can be implemented with an N:1 differential serializing transmitter, such as 6:1 data serializers or 8:1 data serializers. Output driver transistors can also be implemented as electrostatic discharge (ESD) protection clamps. Additionally, a regulated power supply can be implemented to receive DLL power and clock tree power, which reduces power supply jitter and improves timing margins.

Figure 2:
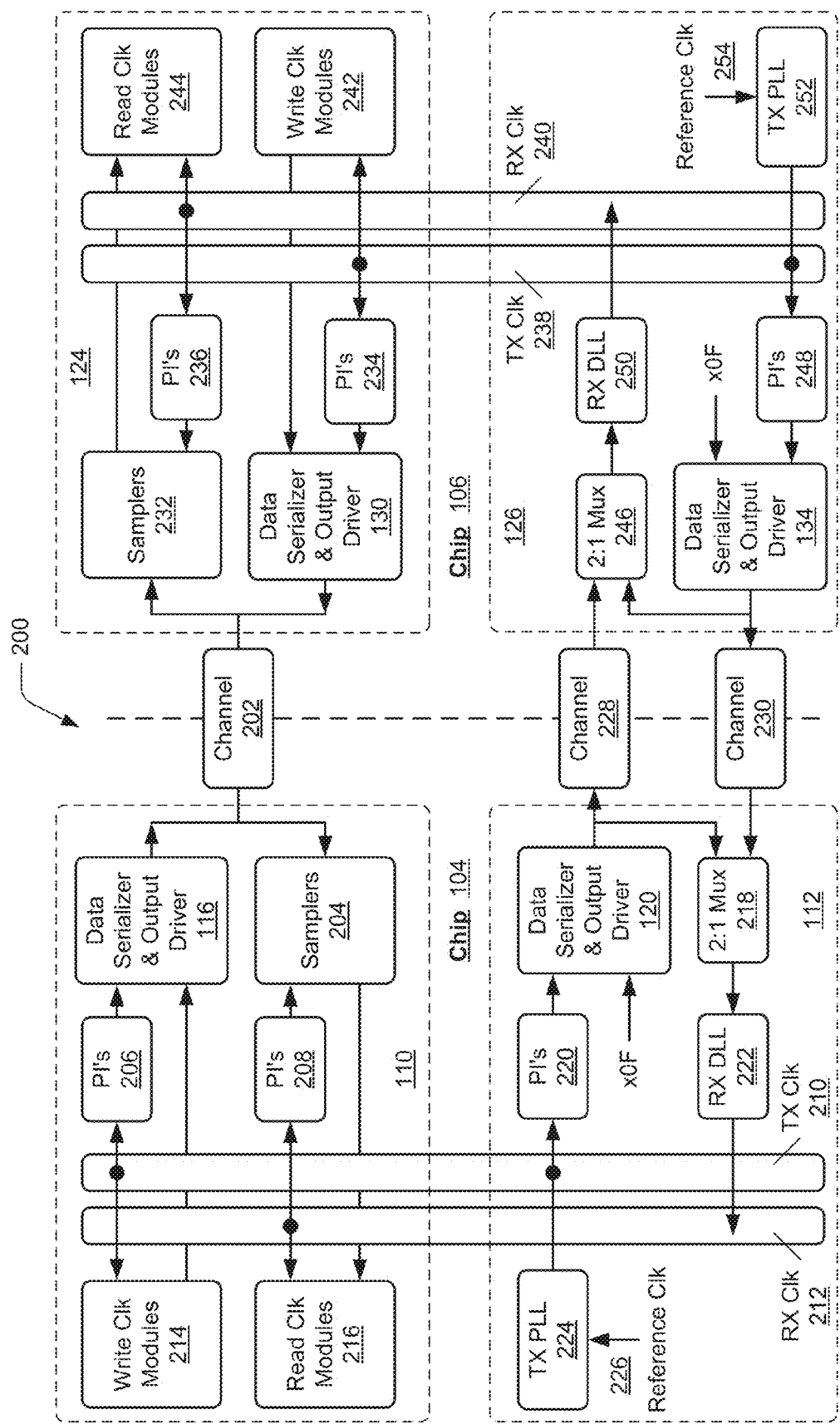
FIG. 2 further illustrates example components of the high-speed I/O data system in accordance with one or more embodiments.

FIG. 2 further illustrates example components 200 of the high-speed I/O data system 100 described with reference to FIG. 1. The system includes the first chip 104 with the data circuit 110 and the clock circuit 112, and the second chip 106 includes the data circuit 124 and the clock circuit 126. In embodiments, the data circuit 110 is implemented with the data serializer and output driver 116, and the data circuit 124 is implemented with the data serializer and output driver 130. The data circuit 110 and clock circuit 112 of the first chip 104, and the data circuit 124 and clock circuit 126 of the second chip 106 forms a chip-to-chip I/O data interface via the data channels 108. The data channels include a data channel 202 for data communication between the data serializer and output driver 116 of the first data circuit 110 and the data serializer and output driver 130 of the second data circuit 124. In embodiments, the data channel 202 is implemented as a bi-directional data channel (×8) that communicates data one-way at a time for faster performance (e.g., faster, high-speed data communication).

The example components 200 of the high-speed I/O data system 100 are implemented for transmit clock generation, forward error code calculation, data serialization, controlled-impedance transmission and termination, receive clock generation, data de-serialization, and error detection and correction. The data circuit 110 of the first chip 104 includes the data serializer and output driver 116, as well as the additional data circuit modules (i.e., referenced as 118 in FIG. 1). The data circuit modules include samplers 204 (e.g., a set of 16 samplers), a transmitter clock phase interpolator 206, a receiver clock phase interpolator 208, a transmitter clock distribution 210 (e.g., 8-phase TX Clk distribution), and a receiver clock distribution 212 (e.g., 8-phase RX Clk distribution). The data circuit 110 also includes additional write clock modules 214 and read clock modules 216 that are described with reference to FIG. 3.

The clock circuit 112 of the first chip 104 includes the data serializer and output driver 120, as well as the additional clock circuit modules (i.e., referenced as 122 in FIG. 1). The clock circuit modules include a 2:1 Mux 218, clock phase interpolators 220, a receiver delay locked loop (DLL) 222, and a transmitter phase locked loop (PLL) 224 (e.g., a ring oscillator-based transmit PLL) that receives a reference clock input 226. The clock circuit 112 also includes the transmitter clock distribution 210 and the receiver clock distribution 212. The first clock circuit 112 interfaces with the second clock circuit 126 via data channels 228, 230 that are each unidirectional forwarded clock channels.

The data circuit 124 of the second chip 106 is symmetric to the data circuit 110 of first chip 104. Similarly, the clock circuit 126 of the second chip 106 is symmetric to the clock circuit 112 of the first chip 104. In this example, the data circuit 124 of the second chip 106 includes the data serializer and output driver 130, as well as the additional data circuit modules (i.e., referenced as 132 in FIG. 1). The data circuit modules include samplers 232 (e.g., a set of 16 samplers), a transmitter clock phase interpolator 234, a receiver clock phase interpolator 236, a transmitter clock distribution 238 (e.g., 8-phase TX Clk distribution), and a receiver clock distribution 240 (e.g., 8-phase RX Clk distribution). The data circuit 124 also includes additional write clock modules 242 and read clock modules 244 that are described with reference to FIG. 3.

The clock circuit 126 of the second chip 106 includes the data serializer and output driver 134, as well as the additional clock circuit modules (i.e., referenced as 136 in FIG. 1). The clock circuit modules include a 2:1 Mux 246, clock phase interpolators 248, a receiver delay locked loop (DLL) 250, and a transmitter phase locked loop (PLL) 252 (e.g., a ring oscillator-based transmit PLL) that receives a reference clock input 254. The clock circuit 126 also includes the transmitter clock distribution 238 and the receiver clock distribution 240.

Figure 3:
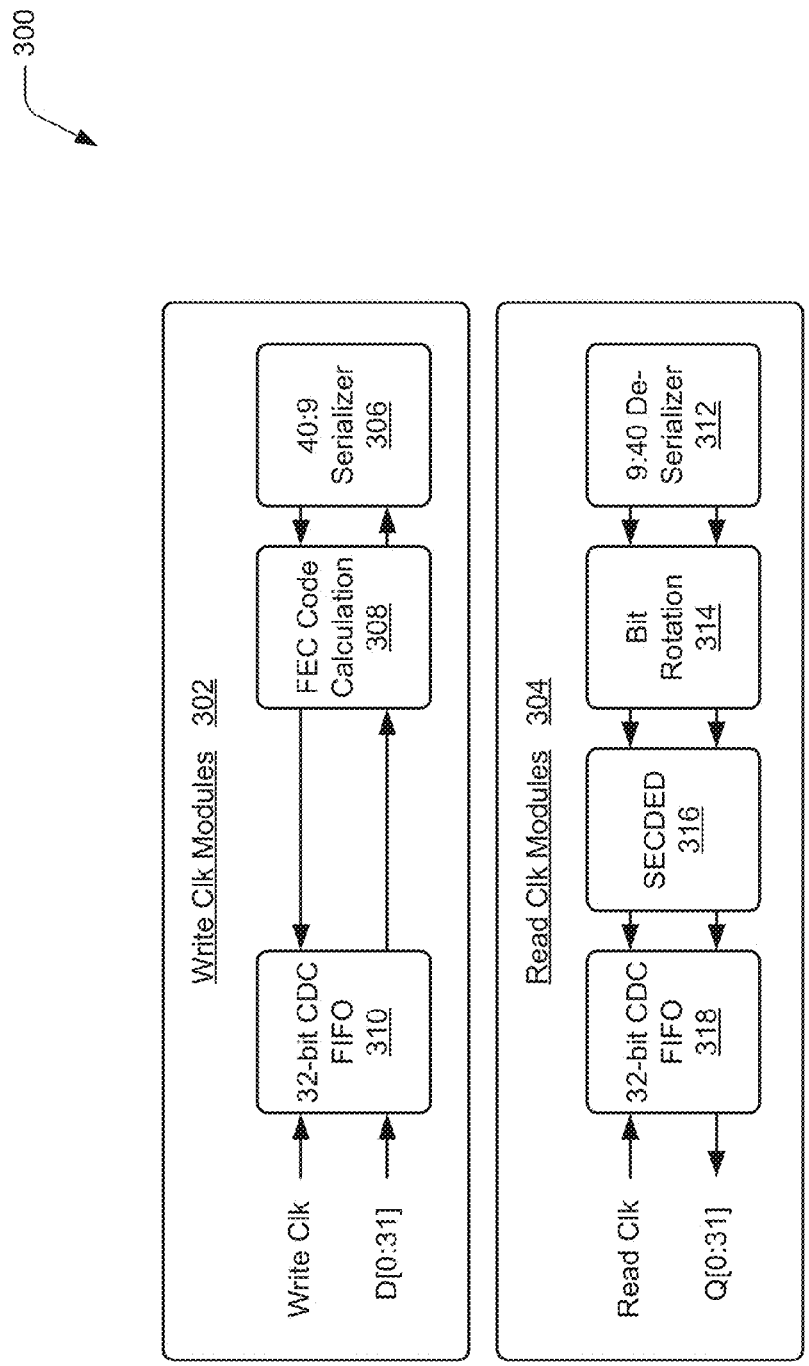
FIG. 3 further illustrates example components of the high-speed I/O data system in accordance with one or more embodiments.

FIG. 3 further illustrates example components 300 of the high-speed I/O data system described with reference to FIGS. 1 and 2. The example components 300 include write clock modules 302, which are the additional write clock modules 214 of the data circuit 110 and the additional write clock modules 242 of the data circuit 124. The example components 300 also include read clock modules 304, which are the additional read clock modules 216 of the data circuit 110 and the additional read clock modules 244 of the data circuit 124. The additional write clock modules and read clock modules of the second data circuit 124 are symmetrical to the respective write clock modules and read clock modules of the first data circuit 110. The write clock modules 302 include a serializer 306 (e.g., a 40:8 or 40:9 serializer), a forward error code (FEC) calculation 308 for double-word based error code calculation, and a thirty-two bit CDC FIFO 310. The read clock modules 304 include a de-serializer 312 (e.g., an 8:40 or 9:40 de-serializer), bit rotation 314, a SECDED 316 (e.g., error detection and correction), and a thirty-two bit CDC FIFO 318. A double-word based error code calculation technique is utilized to reduce the latency that is common with packet-based error code calculation techniques.

In embodiments, the chip-to-chip I/O interface includes a data transmitter (e.g., that includes a differential serializing transmitter), a forwarded-clock transmitter, a forwarded-clock receiver, and a data receiver (e.g., also referred to herein as a de-serializing data receiver). A forwarded-clock channel utilizes a delay locked loop (DLL) to generate clocks and synchronize with the jitter that may be seen in the data transmitter. The clock edge on a DLL input is fully synchronous with the transmitter clock, which is fully synchronous with the clock on the data bus that drives the data. The clock on the data bus and the timing clock originate from the same source, and can be compared for synchronous operation.

The data transmitter includes the clock-domain crossing FIFO 310, the forward error correction (FEC) code generator 308, the clock phase interpolator 206, and the data serializer and output driver 116 (e.g., implemented as a differential serializing transmitter and output driver). The data receiver includes the set of data samplers 204, the clock phase interpolator 208, the de-serializer 312, the bit rotation block 314, the error detection and correction block 316, and the clock-domain crossing FIFO 318. The chip-to-chip I/O interface includes the PLL-based multi-phase clock generator 224 to generate transmit serializer clocks, and includes the DLL-based multi-phase clock generator 222 to generate receive sample clocks.

The receive samplers 204 provide for two data samplers per unit interval, with the first data sampler continuously sampling the full extent of a serialized non-return to zero (NRZ) data signal (e.g., also commonly referred to as an eye diagram such as described with reference to FIG. 14) so as to locate a center of the NRZ data signal (e.g., the eye center). The second data sampler uses the information to accurately sample the eye center and recover all incoming data without error. All of the phase interpolators can be adjusted under state-machine control so as to maximize receive timing margin. Data transmitters and data receivers are paired to provide for both bidirectional operation and intrinsic self-test capability at wafer sort, packaged test, and in-system. Receive data eyes are readily generated and bit error rate readily measured on any channel at any stage of production test and at any time in a live system.

Figure 4:
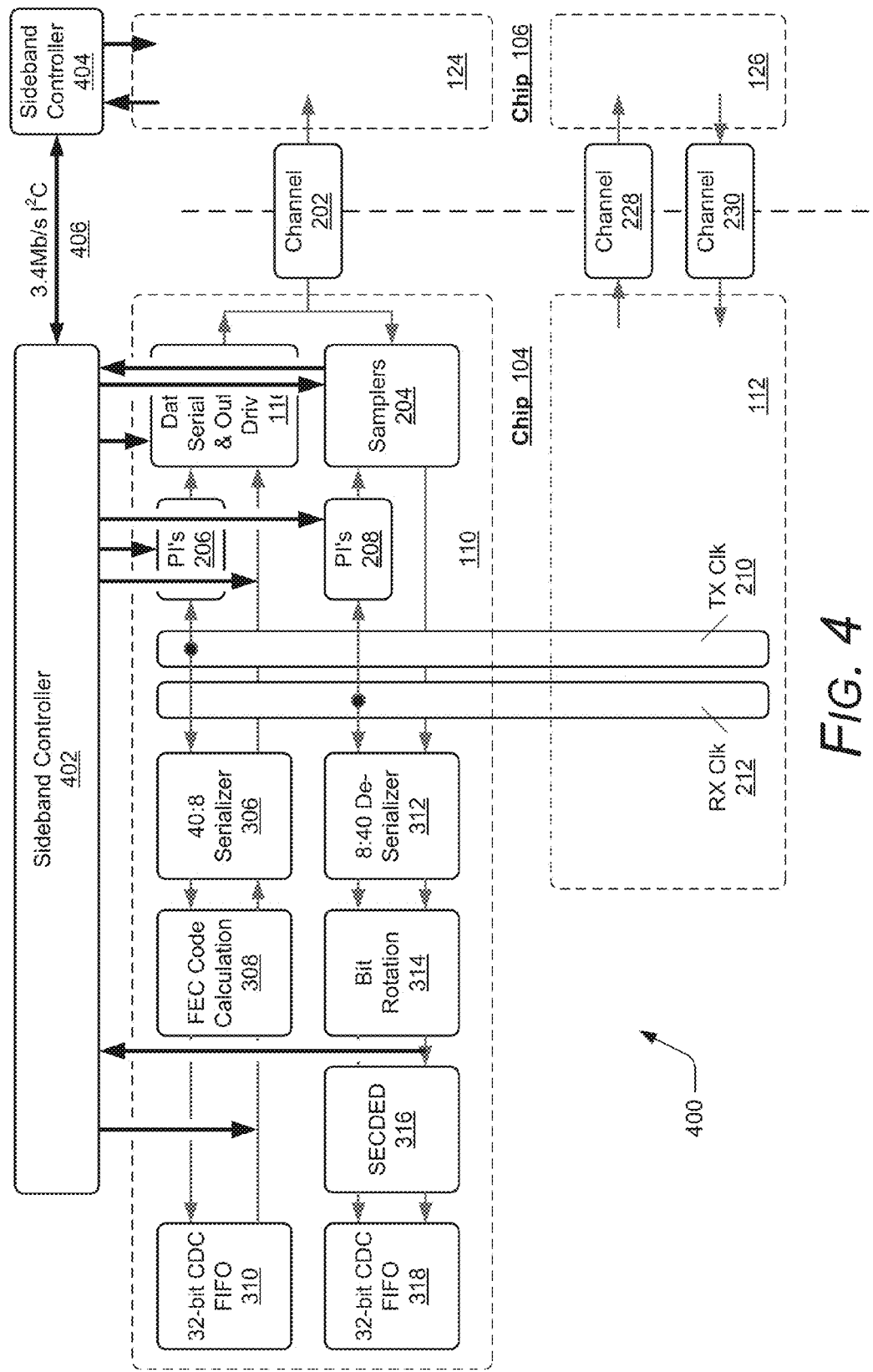
FIG. 4 illustrates an example system in which embodiments of a high-speed I/O data system that includes sideband control can be implemented.

FIG. 4 illustrates an example system 400 in which embodiments of a high-speed I/O data system that includes sideband control for system optimization control can be implemented. In this example, the high-speed I/O data system is implemented as described with reference to FIGS. 1-3. A first sideband controller 402 is implemented to control the data circuit 110 of the first chip 104, and a second sideband controller 404 is implemented to control the data circuit 124 of the second chip 106. The sideband controller 404 for the data circuit 124 of the second chip 106 is symmetric to the sideband controller 402 for the data circuit 110 of the first chip 110. The sideband controllers interface via a data bus 406, such as an I²C data bus, or similar. In implementations, one of the sideband controllers may be configured as a master controller of the other to coordinate control features.

In embodiments, the sideband controller 402 is implemented as a low-speed controller for optimization of termination resistance, transmitter (TX) clock phases, TX drive strength, TX pre-emphasis, receiver (RX) sample clock phases, and RX sampler offset. The sideband controller interfaces with the data serializer and output driver 116, the set of samplers 204, the transmitter clock phase interpolator 206, the receiver clock phase interpolator 208, and data output from the modules for bit rotation 314 and the thirty-two bit CDC FIFO 310. The sideband controllers and features are implemented to tune the respective differential serializing transmitters of the first and second chips to high-performance, faster data processing and communication.

Figure 5:
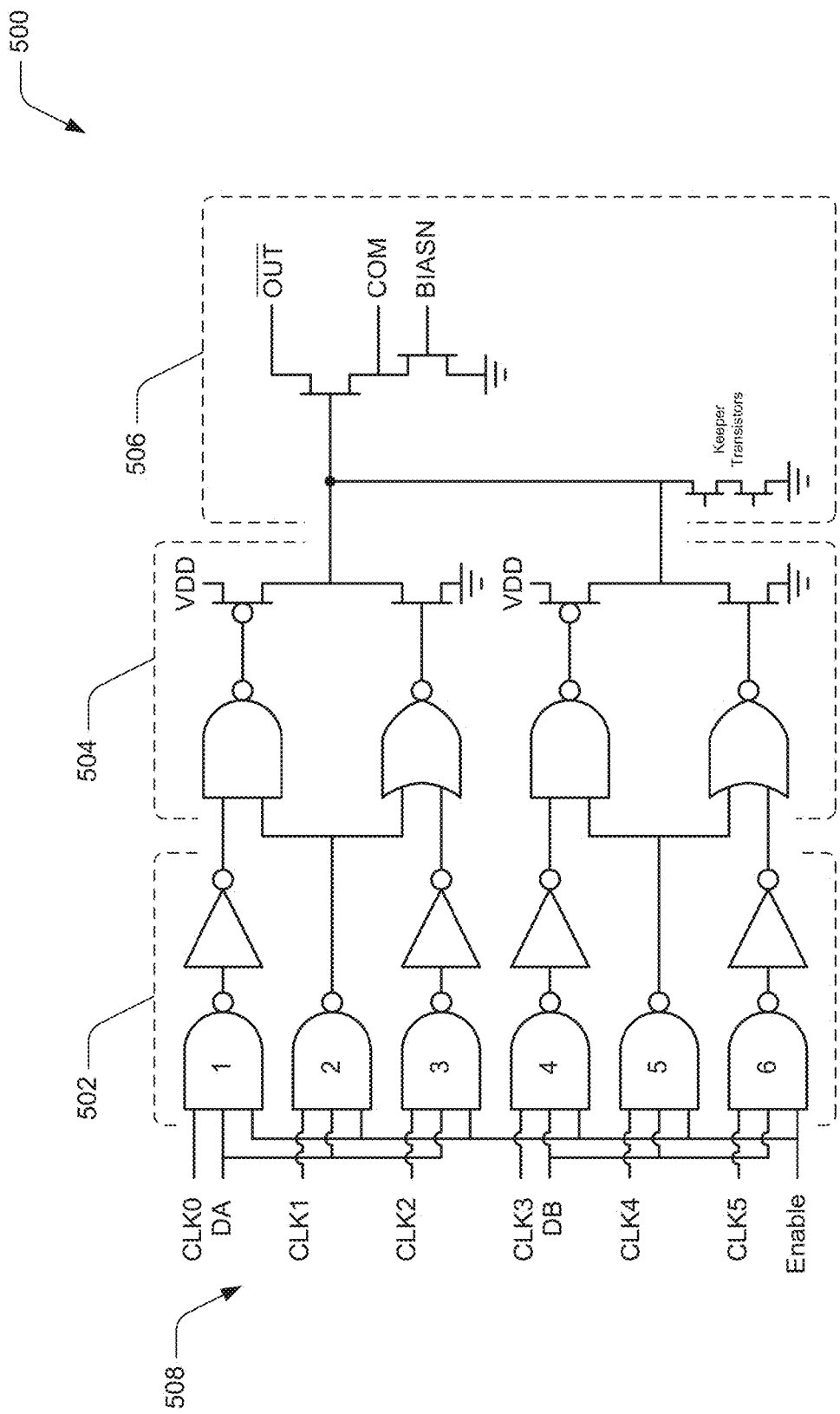
FIG. 5 illustrates an example of a transmitter drive unit in accordance with one or more embodiments.

FIG. 5 illustrates an example of a transmitter drive unit 500 in accordance with embodiments of a differential serializing transmitter. In this example, the transmitter drive unit includes six data-gated clock buffers 502, two data-controlled pulse generators 504, and an output driver 506. Six clock input signals 508 are coupled to the data-gated clock buffers. Each input signal has a frequency of 1/NT, and each input signal has one of relative phases f0, T, 2T, (N/2)T, (N/2+1)T, and (N/2+2)T. Each of the six data-gated clock buffers includes a nand gate used to selectively gate one of the clock input signals depending on the value of a data input signal and, optionally, an enable input signal.

The outputs of the second and fifth nand gates are not inverted, while the outputs of the other four nand gates are each buffered by an inverter. The data-controlled pulse generator includes two push-pull buffers having outputs wire-or'd together, along with two nand gates and two nor gates used to apply pulsed input signals to the push-pull buffers. The outputs of the data-gated clock buffers are coupled to the inputs of the nand and nor gates of the data-controlled pulse-generator. To facilitate overlap optimization of data-controlled pulse generator output pulses, the first and fourth nand gates of the data-gated clock buffers can include a variable delay function. The time division multiplexer may further include a set of N-phase interpolators to facilitate phase correction of the clock input signals.

Figure 6:
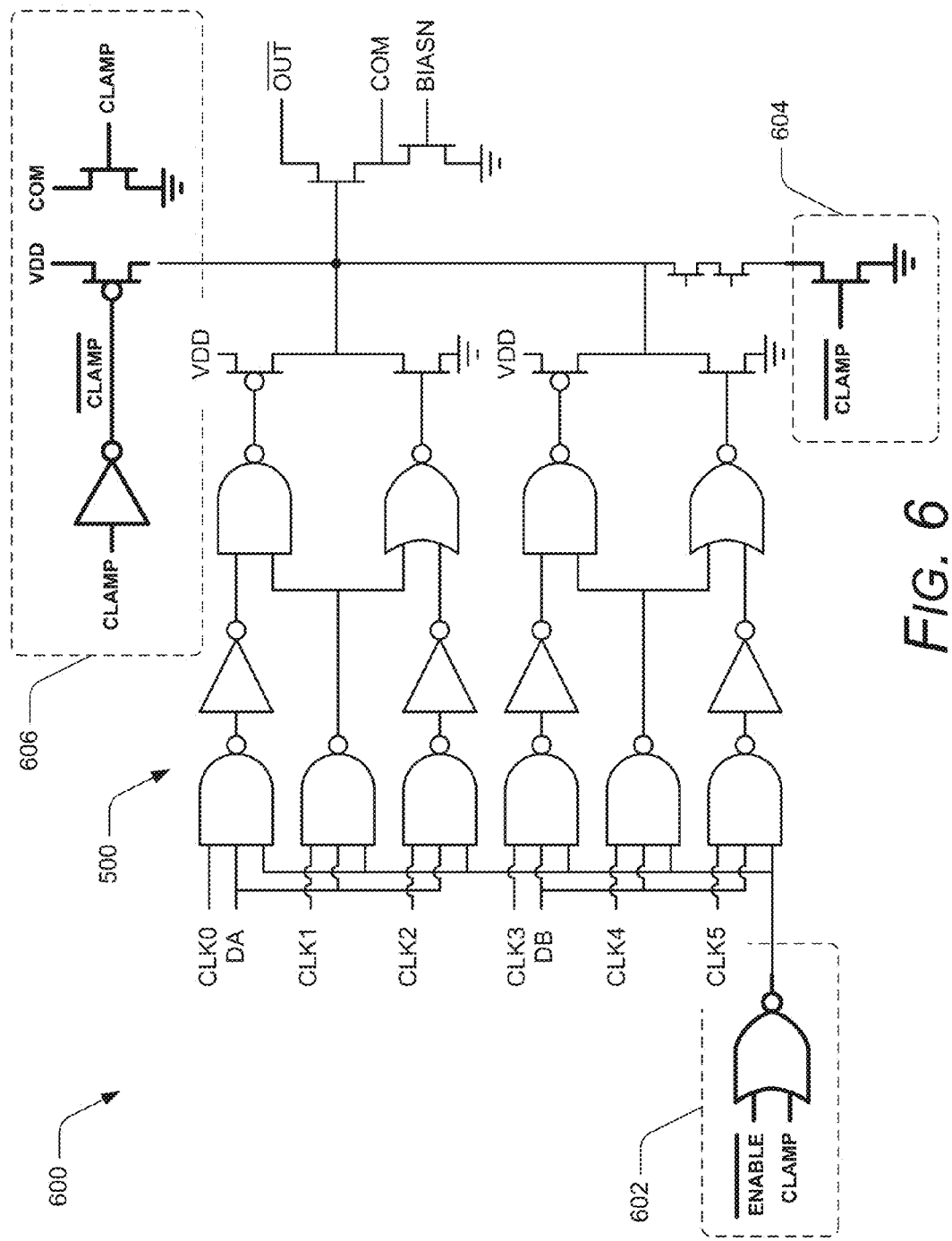
FIG. 6 illustrates an example of the transmitter drive unit implemented with additional circuit components for ESD protection in accordance with one or more embodiments.

FIG. 6 further illustrates an example 600 of the transmitter drive unit 500 described with reference to FIG. 5 with additional circuit components for electrostatic discharge (ESD) protection. The ESD circuit protection includes the components at 602, 604, and 606 that are implemented for circuit protection.

Figure 7:
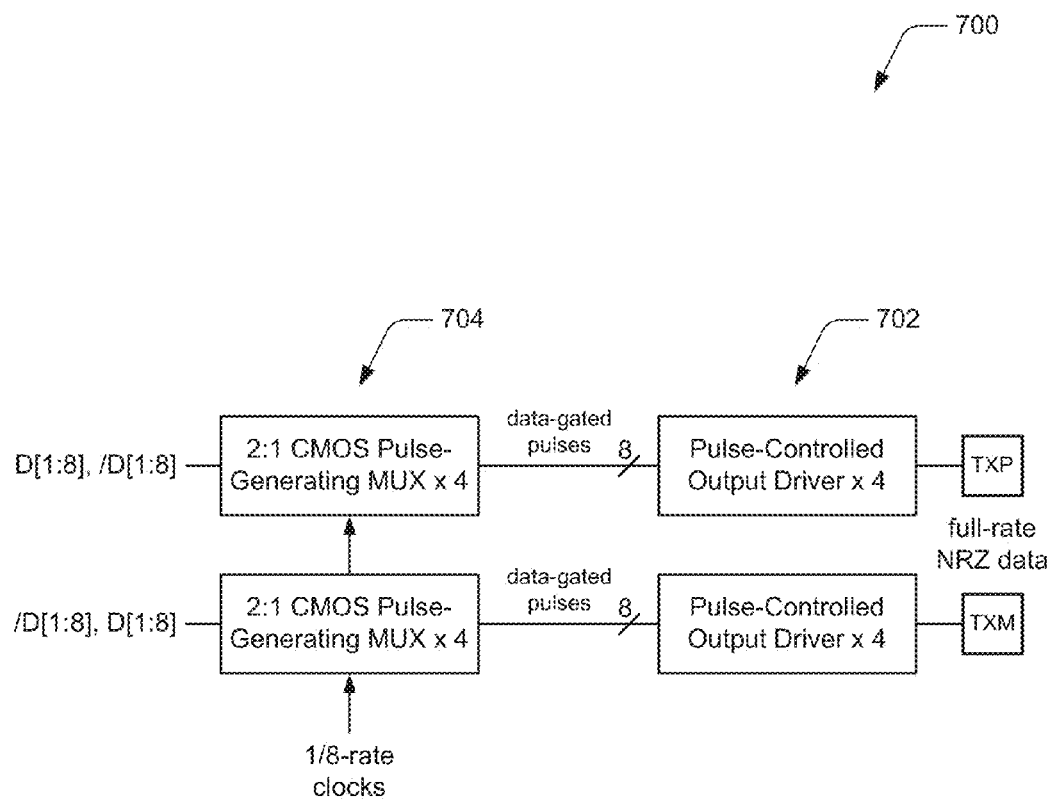
FIG. 7 illustrates an example of a high-speed differential serializing transmitter that can be implemented in a high-speed I/O data system in accordance with one or more embodiments.

FIG. 7 illustrates an example of a high-speed differential serializing transmitter 700. A series-terminated output driver 702 includes a 4:1 multiplexer function by the wire-OR'ing of the outputs of four pulse-controlled series-terminated output drivers. For low-power operation, the series-terminated output driver provides the same output signal amplitude at one-fourth (¼) of the power of a parallel-terminated output driver. Pulses can be utilized for multiplexer control, and the serializing transmitter 700 has a two-stage method of pulse generation. The serializing transmitter uses those pulses to control a push-pull series-terminated multiplexing output driver, rather than a CML multiplexer. Input signaling to the output driver includes ¼-rate data-gated CMOS pulses, rather than a full-rate NRZ data stream, so no individual pulse can interfere with any other pulse, and there is no contribution to inter-symbol interference in the final NRZ data stream. To generate data-controlled pulses for the each output driver, four 2:1 CMOS pulse-generating multiplexers 704 are controlled by eight ⅛-rate clocks and eight bits of data. The phases of the clocks are evenly distributed through 360 degrees. Although the serializing transmitter is described as a differential serializing transmitter, it can also be implemented as a single-ended serializing transmitter.

Figure 8:
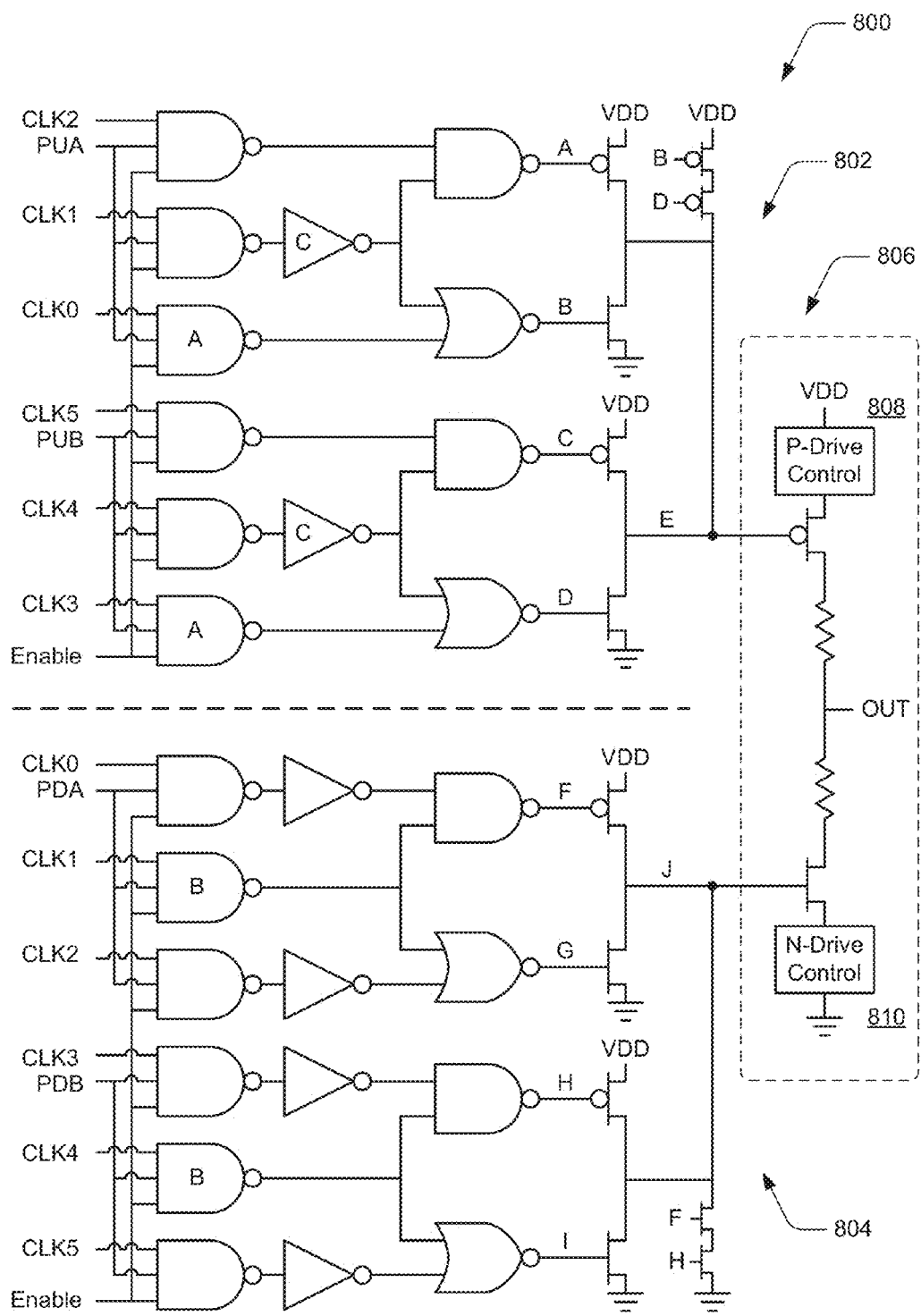
FIG. 8 illustrates an example of a multiplexing drive unit (MDU) in accordance with one or more embodiments.
Figure 9:
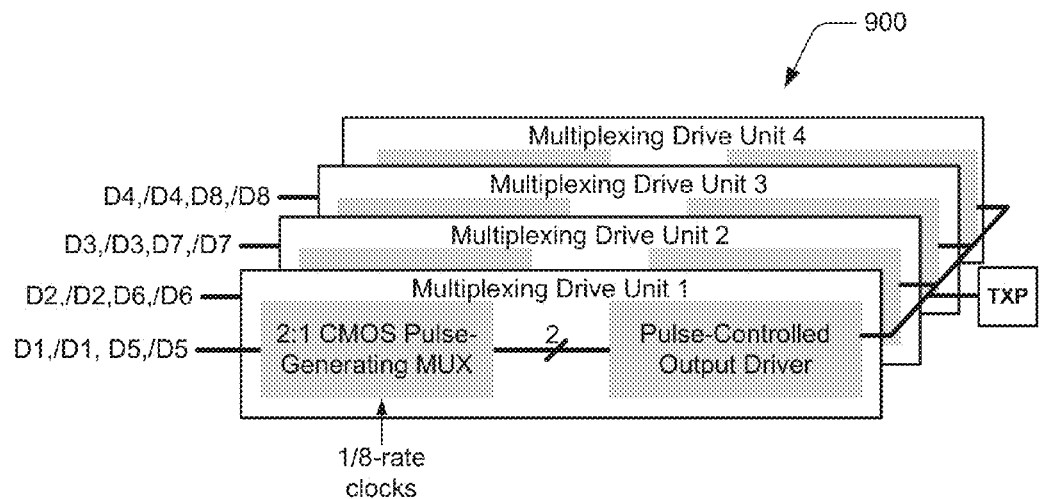
FIG. 9 illustrates an example of a serializing transmitter implemented with four MDUs in accordance with one or more embodiments.

FIG. 8 illustrates an example of a multiplexing drive unit (MDU) 800 that includes a pulse-generating pull-up multiplexer 802, a pull-down 2:1 multiplexer 804, and a pulse-controlled output driver 806. FIG. 9 illustrates an example 900 of connecting four MDUs to form an 8:1 single-ended serializing transmitter, where each MDU asserts onto the serializing transmitter output a high or low drive level for two of eight bit times and asserts no drive level for six bit times.

Within each MDU, two data-controlled pulse generators form a 2:1 multiplexer which generates pulses to control a pull-up transistor of the output driver. A second pair of data-controlled pulse generators generate controlling pulses for a second 2:1 multiplexer, which in turn generates pulses to control a pull-down transistor of the output driver. Within the data-controlled pulse generator, an assertion pulse generator (a NAND or NOR gate, depending on pulse polarity) generates a pulse that induces a transition at the 2:1 multiplexer output from a de-asserted state to an asserted state. A de-assertion pulse generator (a NOR or NAND gate) generates a pulse one bit time later to induce a transition at the 2:1 multiplexer output from its asserted state to its de-asserted state.

Small keeper transistors can be used to hold the 2:1 multiplexer output in its de-asserted state until the arrival of the next assertion pulse, which could occur as few as two bit-times later, or might never occur, as its arrival is dependent on the data pattern. In an alternative implementation, the de-assertion pulses are not gated by data, thereby ensuring that a de-assertion pulse always occurs and rendering the keeper transistors unnecessary. This alternative implementation consumes slightly more power. Bidirectional capability of the serializing transmitter is inherent in the construction of the MDUs, as their outputs can be tri-stated by de-asserting all data inputs.

In FIG. 8, the pulse-controlled output driver 806 of the MDU 800 includes a P-drive control 808 and an N-drive control 810. Using a feedback control loop to control the resistance of the P-drive control and the N-drive control, an MDU's drive resistance tracks an external reference resistor and is programmable.

Figure 10:
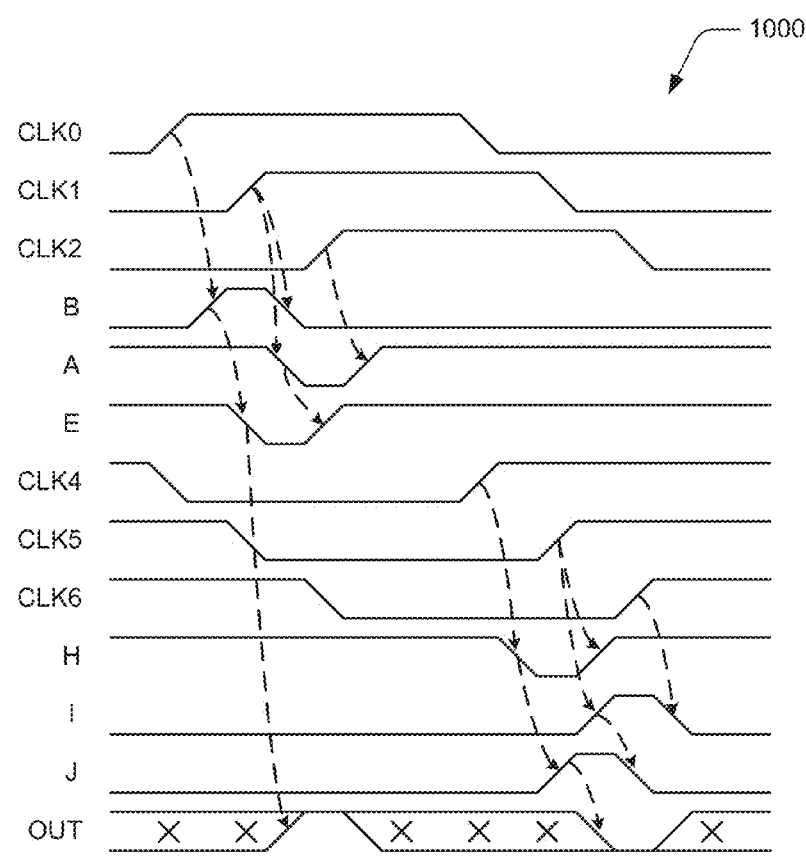
FIG. 10 illustrates an example of the functionality and timing of an MDU in accordance with one or more embodiments.

FIG. 10 illustrates an example 1000 of the functionality and timing of a single MDU during eight bit-times when PUA=PDB=1 and PDA=PUB=0 (PUA, PDB, PDA, and PUB are shown in FIG. 8). Here, the MDU asserts a high level at its output in one bit time, and asserts a low level at its output four bit times later. During the other six bit-times, the MDU output is tri-stated.

Several aspects of the MDU contribute to its high-speed and low-power operation. For example, NRZ data is carried on just one net, OUT, and there is no longer the need for a 2:1 multiplexer to generate a full-rate, pre-driver NRZ data stream to drive an output driver. This provides for substantial power savings and an overall bandwidth improvement over previous implementations, as there is no pre-driver NRZ data stream that limits performance and may itself be in need of equalization. Apart from OUT, the highest-speed nets of the MDU do not carry NRZ data, but rather, single pulses one bit-time wide. Because these pulses occur no more frequently than every fourth bit-time on any given net, they have a full three bit-times to return to the de-asserted level, and do not contribute to ISI at OUT. Any ISI that may appear in the NRZ data stream at OUT is readily corrected by standard transmit de-emphasis and receive equalization circuits used to correct for channel-induced ISI.

In other aspects, the MDU serializes two stages of pulse-toggled multiplexing, deriving substantial speed-power advantage from each stage. An inherently low-power push-pull series terminated output driver is integrated with a high-performance pulse-toggled 4:1 multiplexer. This provides for both a reduction in power and an increase in speed, compared to conventional techniques where these functions are implemented separately. The circuit topology contributes to high bandwidth on its highest-speed nets in two different ways. First, the gates that create and transfer these pulses all have very low fan-out (between ½ and 1) and very low fan-in (between 1 and 2). Second, the topology allows for the nets that carry these pulses (nets A-J in FIG. 2) to be physically very short. Further, by gating clocks CLK0-CLK7 with the data signals PUA, PUB, PDA, and PDB at the very root of the logic paths in the MDU, signal transitions and therefore power are minimized.

Figure 11:
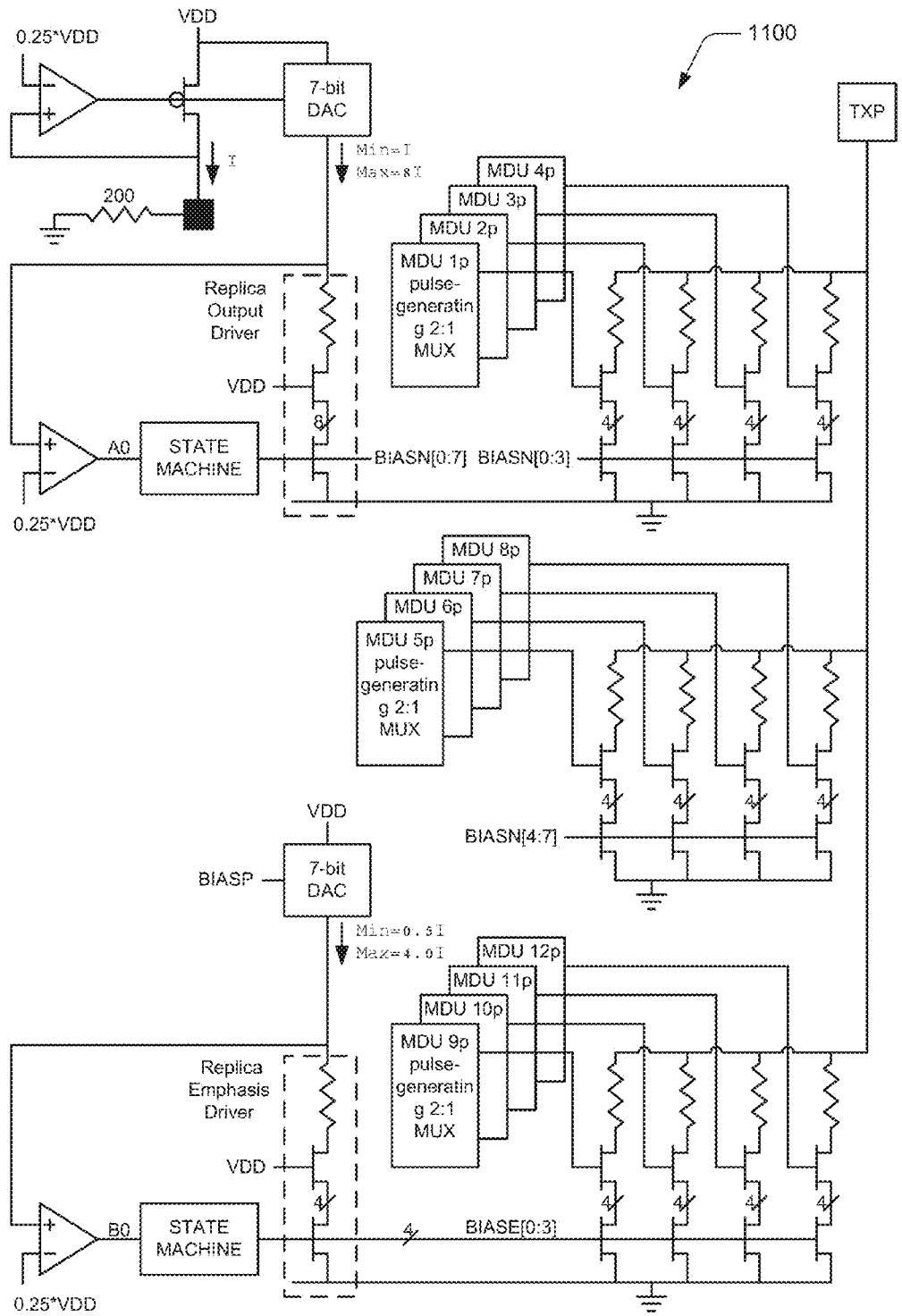
FIG. 11 illustrates a pull-down drive resistance and de-emphasis control circuit in accordance with one or more embodiments of a serializing transmitter.

FIG. 11 illustrates an example 1100 of an MDU pull-down output transistor detail and the control of MDU drive resistance with selectable, equal-weighted output drive segments. A generated current is sourced to an off-chip reference resistor, and a scaled multiple of that current is also sent to an on-chip replica of the output driver. On startup, a state machine asserts control bits BIASN[0:7] to VDD in sequence, thereby turning on segments in the replica output driver one at a time until the voltage at the output of the replica output driver is less than the voltage at the reference resistor. At this time, no additional control bits are asserted, and an analog feedback control loop is then enabled by disconnecting the asserted bits of BIASN[0:7] from VDD and connecting them to net A0. The de-asserted bits of BIASN[0:7] remain held at 0V. The analog feedback control loop then adjusts the voltage of the asserted bits of BIASN[0:7] until the drive resistance of the replica pull-down output driver is the desired fraction of the external reference resistor, independent of PVT. A 7-bit DAC provides for adjustment of pull-down drive resistance from 25 ohms to 200 ohms in 128 steps. Also shown is a replica emphasis pull-down driver and a second 7-bit DAC for the adjustment of emphasis driver pull-down drive resistance from 50 ohms to 400 ohms in 128 steps. Similar circuits and methods control pull-up output transistor drive resistance.

Note the use of analog feedback control of the BIASN[0:7] and BIASE[0:3] voltages to provide a high resolution of drive resistance control. Because of this analog control, the resolution of drive resistance control is not constrained by the number of driver segments that are independently controlled, but rather 128 levels of termination resistance are achieved with just eight segments.

Overlap of the interleaved pulses that control the final 4:1 multiplexer of the serializing transmitter directly impacts the quality of the transmit eye. As has been described, the serializing transmitter is implemented from multiple MDUs, each generating a share of interleaved output pulses. When these pulses overlap, two output transistors will for a time both be on. If they fail to overlap, no output driver will be on for a time. Non-optimum overlap results in an elevated common-mode transmit signal amplitude as well as transmit eye closure.

Figure 12:
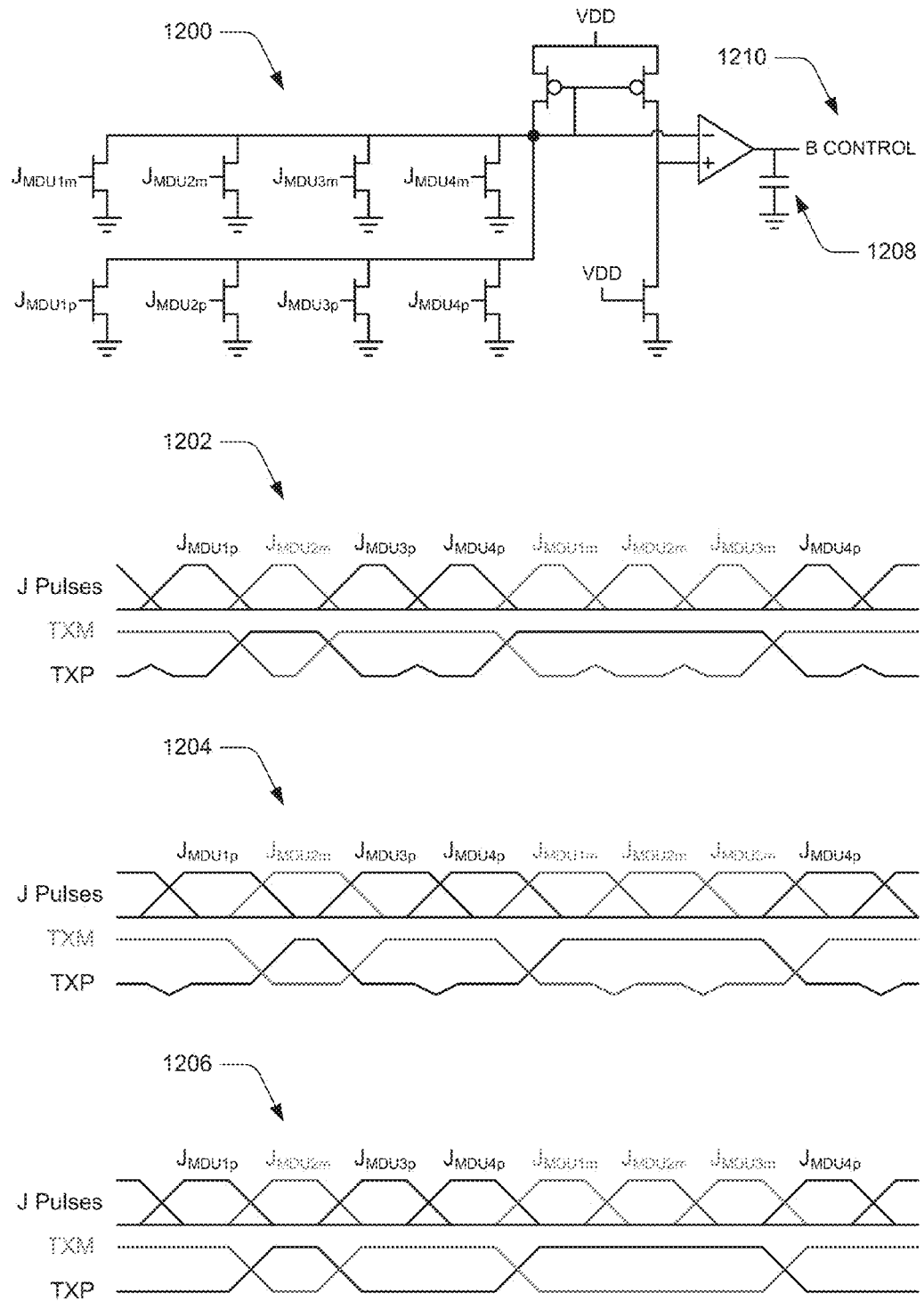
FIG. 12 illustrates a pulse width control circuit in accordance with one or more embodiments of a serializing transmitter.

FIG. 12 illustrates an example control circuit 1200 used to optimize the overlap of pulses on the J-nets of FIG. 8. FIG. 12 further illustrates cases of too little overlap 1202, too much overlap 1204, and optimum overlap 1206. By measuring the difference between a sum of currents generated by the J-pulses and a current generated by a signal that is always high (i.e., at Vdd), the overlap of the J-pulses is determined. Filter capacitor 1208 converts this current difference to a control voltage 1210 that is used to adjust the insertion delay of the MDU "B" NAND gates shown in FIG. 8. When the J-pulses overlap high or low, the control voltage will fall or rise so as to narrow or widen the pulses. When the feedback control loop reaches steady-state, pulse overlap is optimum. A similar but complementary circuit is used to control the overlap of the MDU's active-low E-pulses by adjusting the insertion delay of the MDU "A" NAND gates shown in FIG. 8.

Related to overlap control of the MDUs' J-pulses and the MDUs' E-pulses, relative timing offset between the E-pulses and the J-pulses is minimized by another feedback control loop. This feedback control loop is implemented because the signal paths for the generation of these pulses are topologically different, and while these pulses can be aligned in simulation through careful transistor size adjustment, silicon behavior is likely to vary. When these pulses are offset in phase from each other, eye closure results. A complete I/O system that includes a receiver eye monitor can adjust the relative timing of these pulses by adjusting the insertion delay of MDU "C" inverters shown in FIG. 8 until a maximum eye width is detected at the receiver.

By lowering the cost of high-throughput, low-latency data interconnection, this serializing transmitter can lower costs by making the partitioning of a large system-on-a-chip onto multiple chips less costly than single-chip integration. It can also reduce the cost and improve the performance of any large system that requires substantial data communication to neighboring chips and memory, including supercomputers and Internet servers.

The described embodiments of a serializing transmitter can be implemented with various technologies other than CMOS technology. The voltage supply terminals can be relatively positive or relatively negative, depending upon the particular convention adopted and the technology used. The use of the terms "pull-up" and "pull-down" as described herein are arbitrary terms, and can refer to either a logic high-level or a logic low-level depending on the relative levels of the voltage supply terminals. Likewise, the term "coupled" can include various types of connections or couplings and can include a direct connection or a connection through one or more intermediate components.

Figure 13:
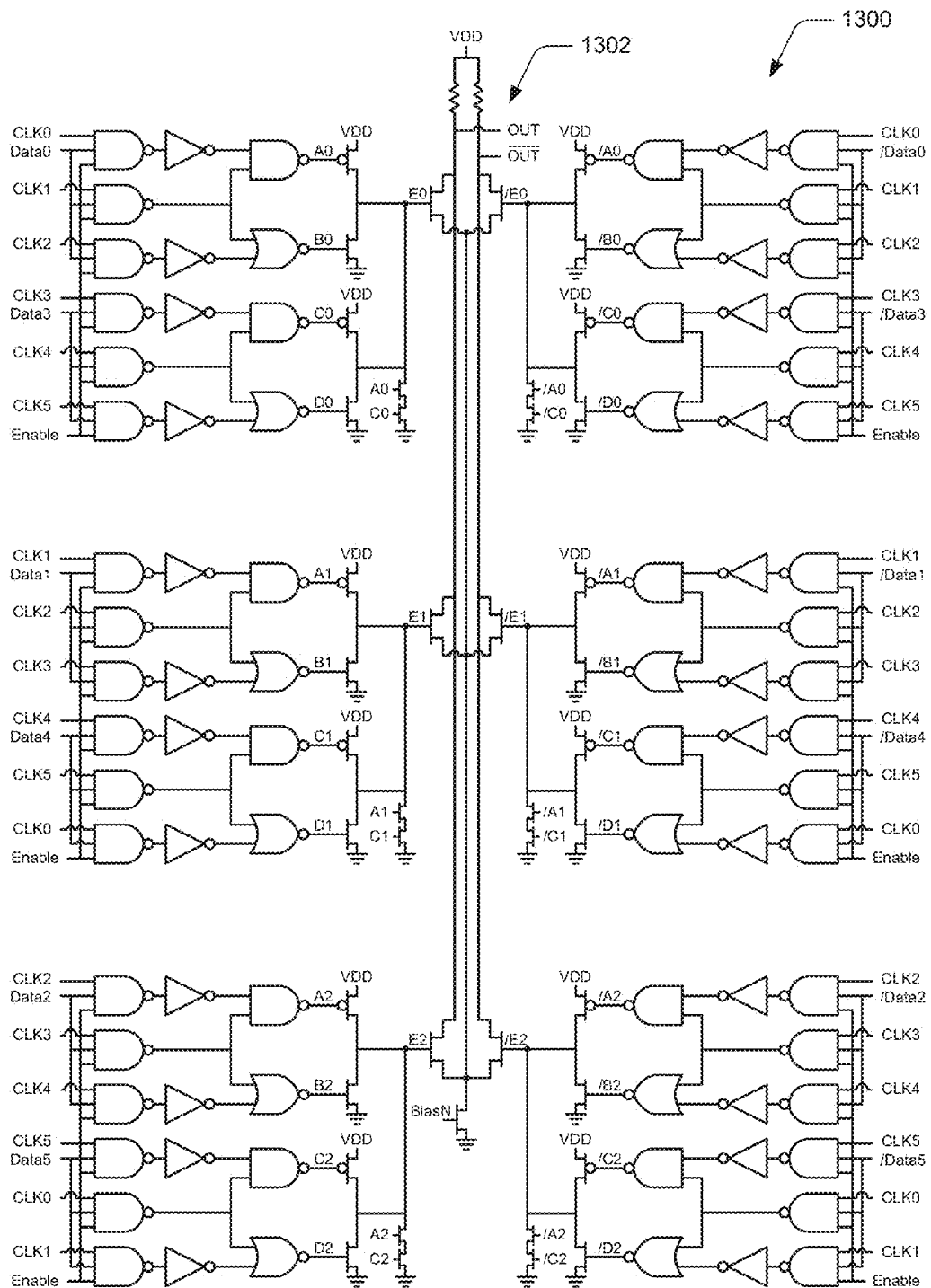
FIG. 13 illustrates an example of a differential serializing transmitter and output driver implemented with multiple transmitter drive units in accordance with one or more embodiments.

FIG. 13 illustrates an example of a differential serializing transmitter 1300 and output driver 1302 implemented with multiple transmitter drive units as described with reference to FIG. 5. In this example, six transmitter drive units are implemented in a wired-or configuration as a 6:1 data serializer and output driver. In an embodiment, the resistive load at the output driver 1302 can be replaced with implementations of the transmitter drive unit 804, shown as a pull-up 2:1 multiplexing pulse generator and described with reference to FIG. 8.

Figure 14:
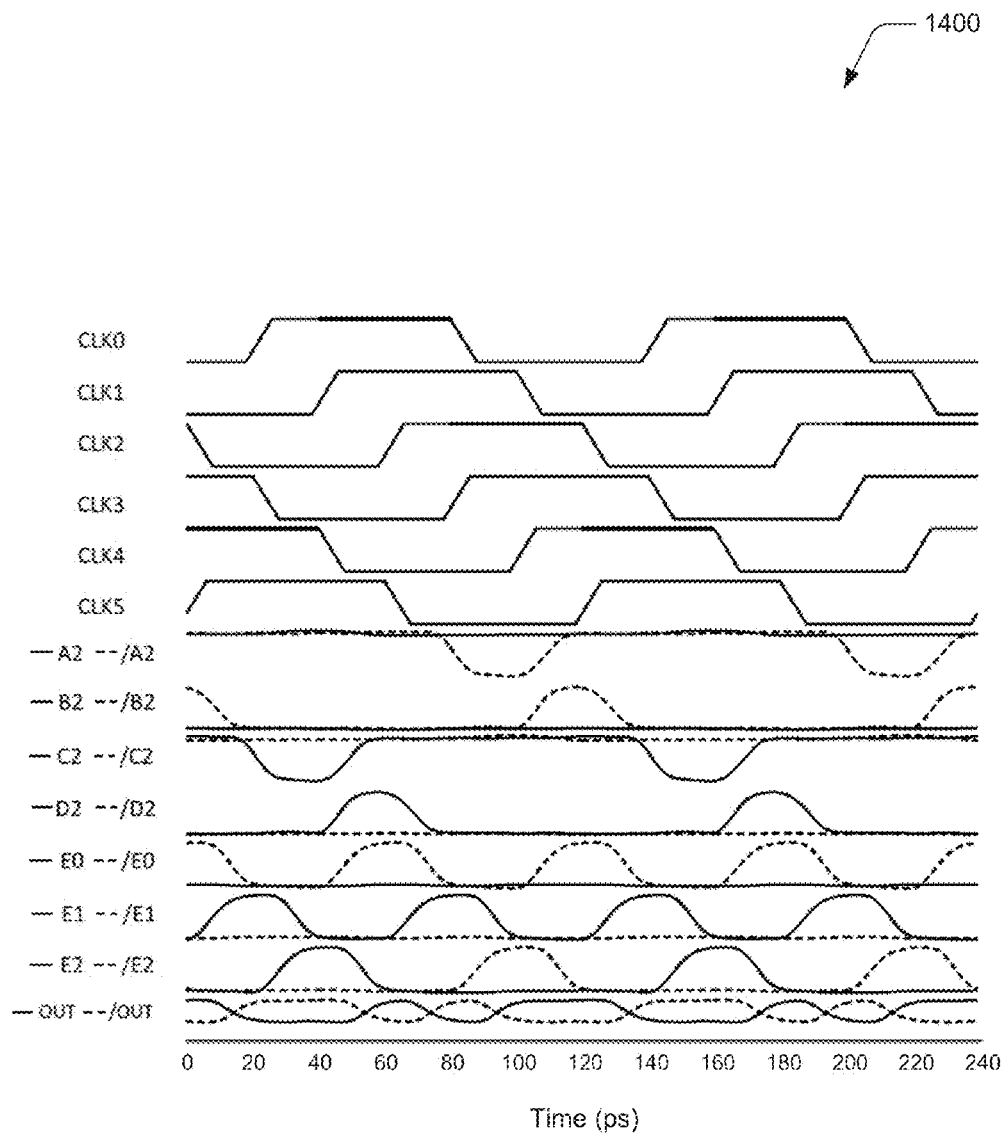
FIG. 14 illustrates example waveforms and timing of the differential serializing transmitter and output driver.
Figure 15:
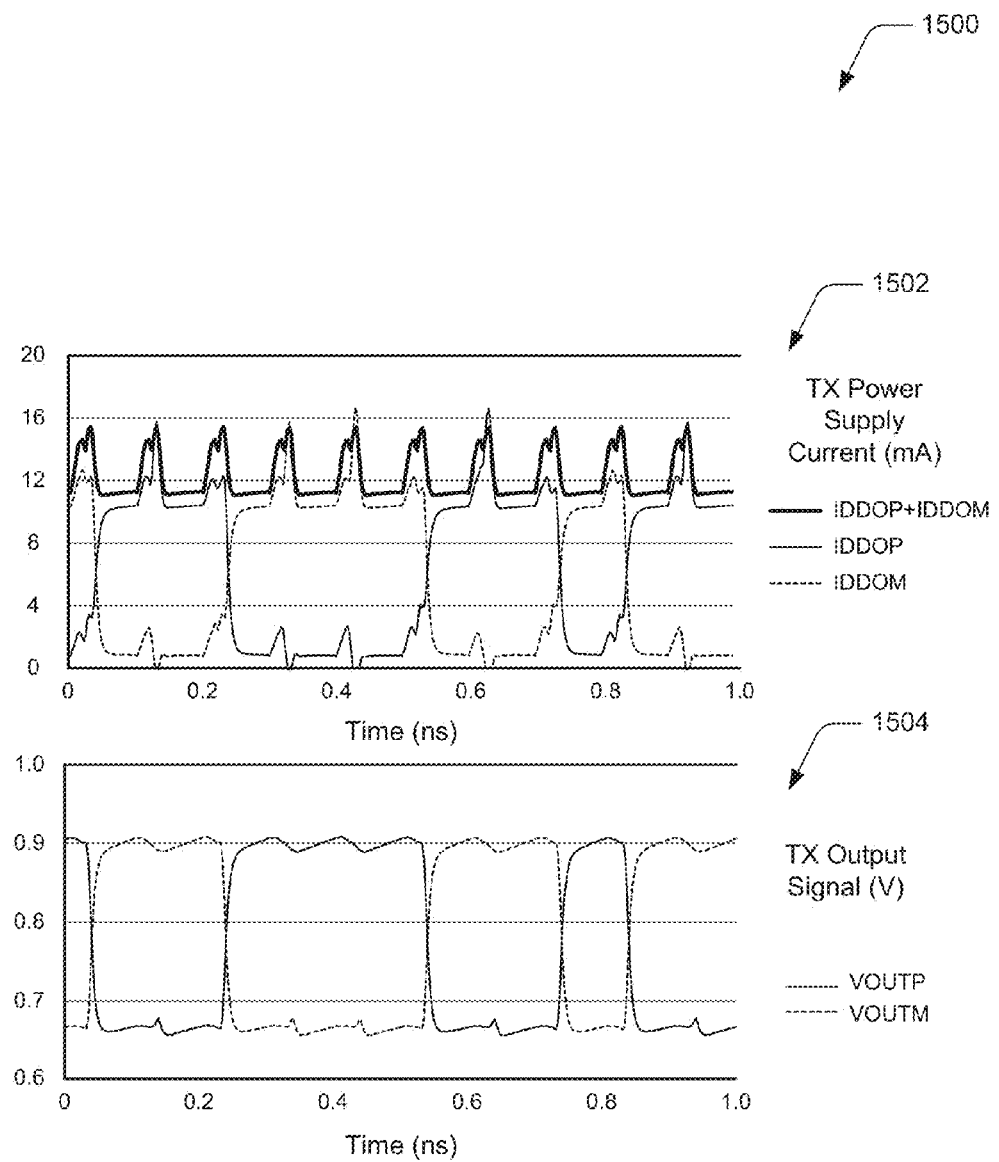
FIG. 15 illustrates an example of power supply current waveforms for the differential serializing transmitter.

FIG. 14 illustrates an example 1400 of data waveforms and clock timing of the differential serializing transmitter described with reference to FIG. 13. FIG. 15 illustrates an example 1500 of power supply current waveforms for the differential serializing transmitter described with reference to FIG. 13. The transmitter power supply current is shown at 1502, and the transmitter output signal is shown at 1504 at approximately 10 Gbps. True and complement driver supply current individually show a data dependency. Their sum, however, shows no data dependency even with the use of predominantly CMOS logic. For a worst-case 2 nH VDDO source inductance, circuit self-capacitance limits VDDO voltage noise to just 50 mVpp. However, because this voltage noise is periodic at the data rate, the VDDO noise does not modulate the signal path insertion delay and therefore does not cause jitter. Because of its constant current, no off-chip power-supply bypassing is needed for the differential serializing transmitter.

Figure 16:
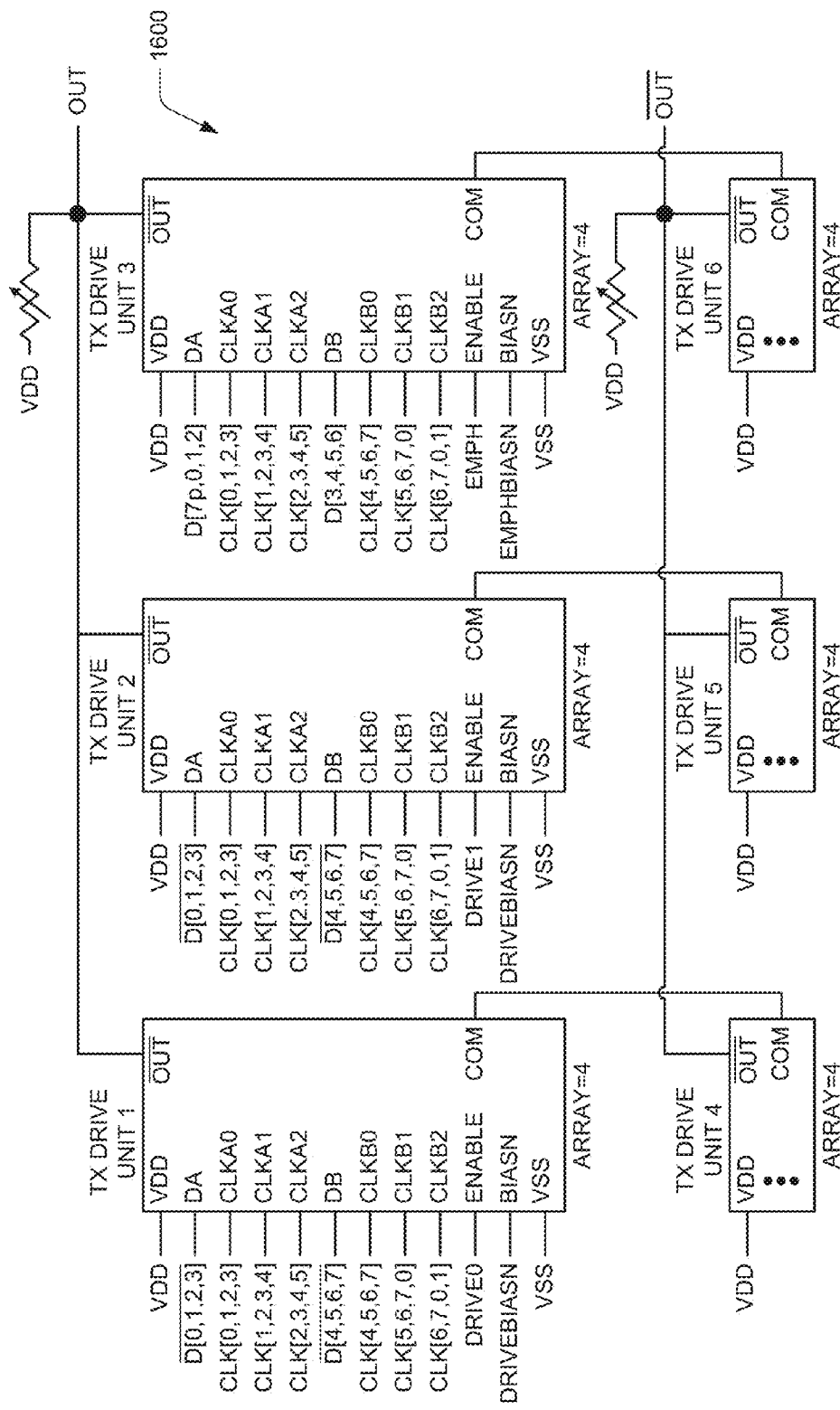
FIG. 16 illustrates an example of a differential serializing transmitter implemented with multiple transmitter drive units in accordance with one or more embodiments.

FIG. 16 illustrates an example of a differential serializing transmitter 1600 (e.g., a data serializer and output driver) implemented with multiple transmitter drive units as described with reference to FIG. 5. In this example, twenty-four transmitter drive units are configured as an 8:1 data serializer and output driver having a variable drive strength and variable pre-emphasis. The transmitter drive units 4-6 are implemented the same as the respective transmitter drive units 1-3 (i.e., transmitter drive unit #4 is the same as transmitter drive unit #1, etc.).

Figure 17:
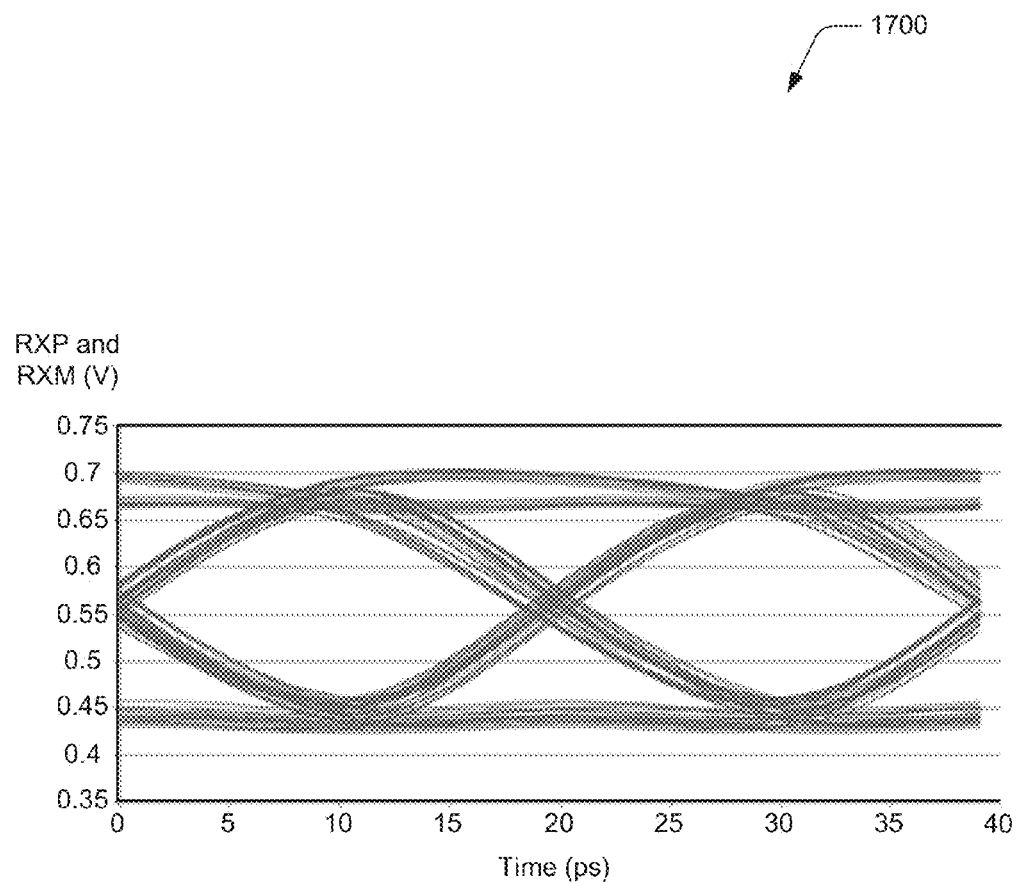
FIG. 17 illustrates an example of a data eye generated with the differential serializing transmitter.

FIG. 17 illustrates an example 1700 of a data eye generated with the differential serializing transmitter described with reference to FIG. 16. The high-speed, low-power performance of the differential serializing transmitter is illustrated with the data eye.

Example method 1800 is described with reference to FIG. 18 in accordance with one or more embodiments of a high-speed I/O data system implemented with serializing transmitters. Generally, any of the services, functions, methods, procedures, components, and modules described herein can be implemented using software, firmware, hardware (e.g., fixed logic circuitry), manual processing, or any combination thereof. A software implementation represents program code that performs specified tasks when executed by a computer processor. The example methods may be described in the general context of computer-executable instructions, which can include software, applications, routines, programs, objects, components, data structures, procedures, modules, functions, and the like. The program code can be stored in one or more computer-readable storage media devices, both local and/or remote to a computer processor. The methods may also be practiced in a distributed computing environment by multiple computer devices. Further, the features described herein are platform-independent and can be implemented on a variety of computing platforms having a variety of processors.

Figure 18:
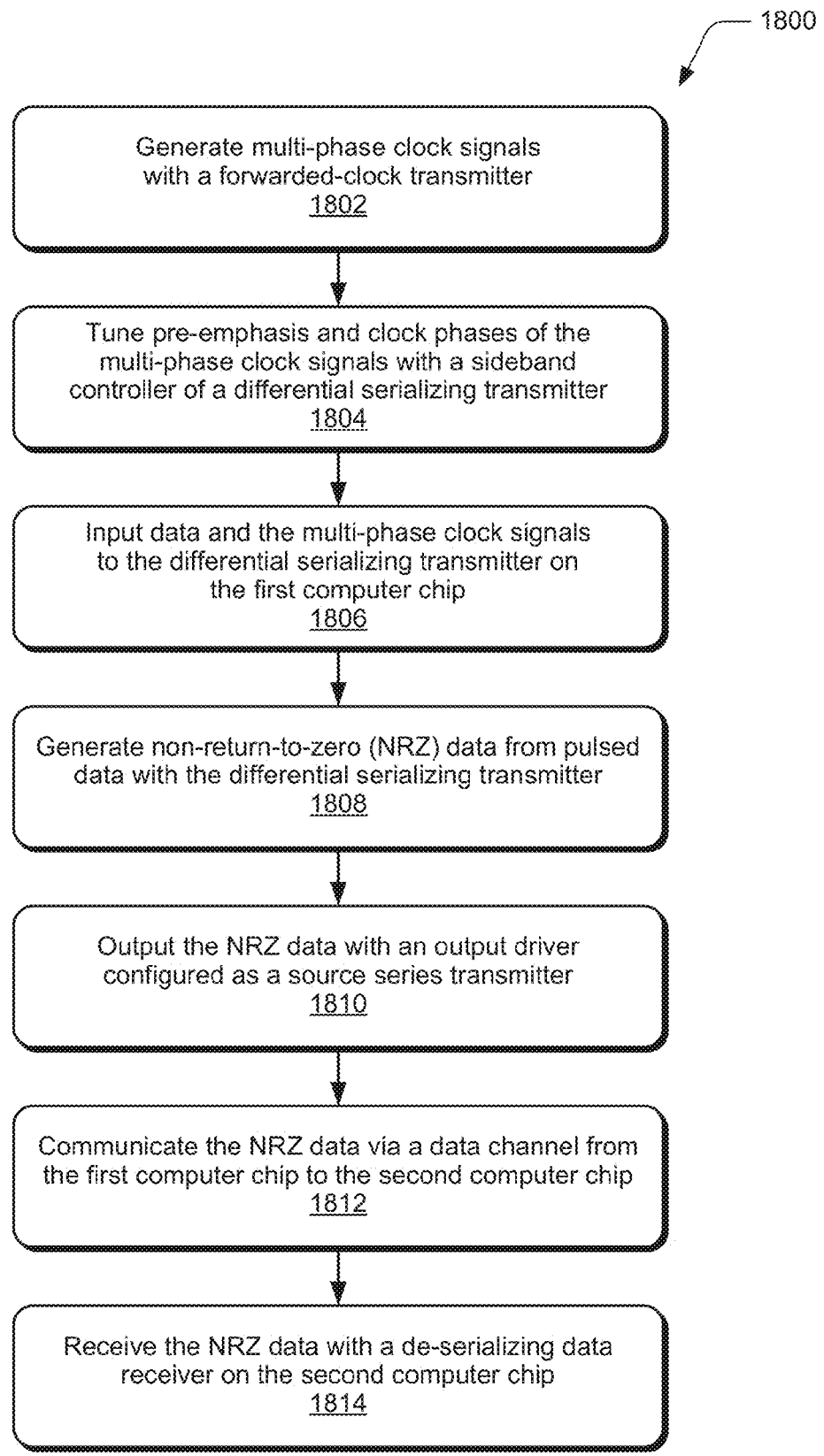
FIG. 18 illustrates example method(s) of a high-speed I/O data system in accordance with one or more embodiments.

FIG. 18 illustrates example method(s) 1800 of a high-speed I/O data system. The order in which the method blocks are described are not intended to be construed as a limitation, and any number of the described method blocks can be combined in any order to implement a method, or an alternate method.

At block 1802, multi-phase clock signals are generated with a forwarded-clock transmitter. For example, the clock circuit 112 on the computer chip 104 generates multi-phase clock signals that are synchronous with power supply jitter. At block 1804, pre-emphasis and clock phases of the multi-phase clock signals are controlled and tuned with a sideband controller of a differential serializing transmitter. For example, the sideband controller 402 controls and tunes at least pre-emphasis and clock phases of the multi-phase clock signals for the differential serializing transmitter 900 that is implemented as a component of the data serializer and output driver 116 in the data circuit 110 on computer chip 104.

At block 1806, data and the multi-phase clock signals are input to the differential serializing transmitter on the first computer chip. For example, the serializer 306 inputs data and the multi-phase clocks signals to the differential serializing transmitter 900 that is implemented as the component of the data serializer and output driver 116 in the data circuit 110 on computer chip 104.

At block 1808, non-return-to-zero (NRZ) data is generated from pulsed data with the differential serializing transmitter and, at block 1810, the NRZ data is output with an output driver configured as a source series transmitter. For example, the differential serializing transmitter that is implemented as the component of the data serializer and output driver 116 in the data circuit 110 generates the NRZ data from pulsed data that is received and output by the output driver 802 that is configured as a source series transmitter.

At block 1812, the NRZ data is communicated via a data channel from the first computer chip to the second computer chip. For example, the data channel 202 communicates the NRZ data from the first computer chip to the second computer chip. At block 1814, the NRZ data is received with a de-serializing data receiver on the second computer chip. For example, the second computer chip 106 includes the de-serializing data receiver that receives the NRZ data via the data channel from the first computer chip 104.

Figure 19:
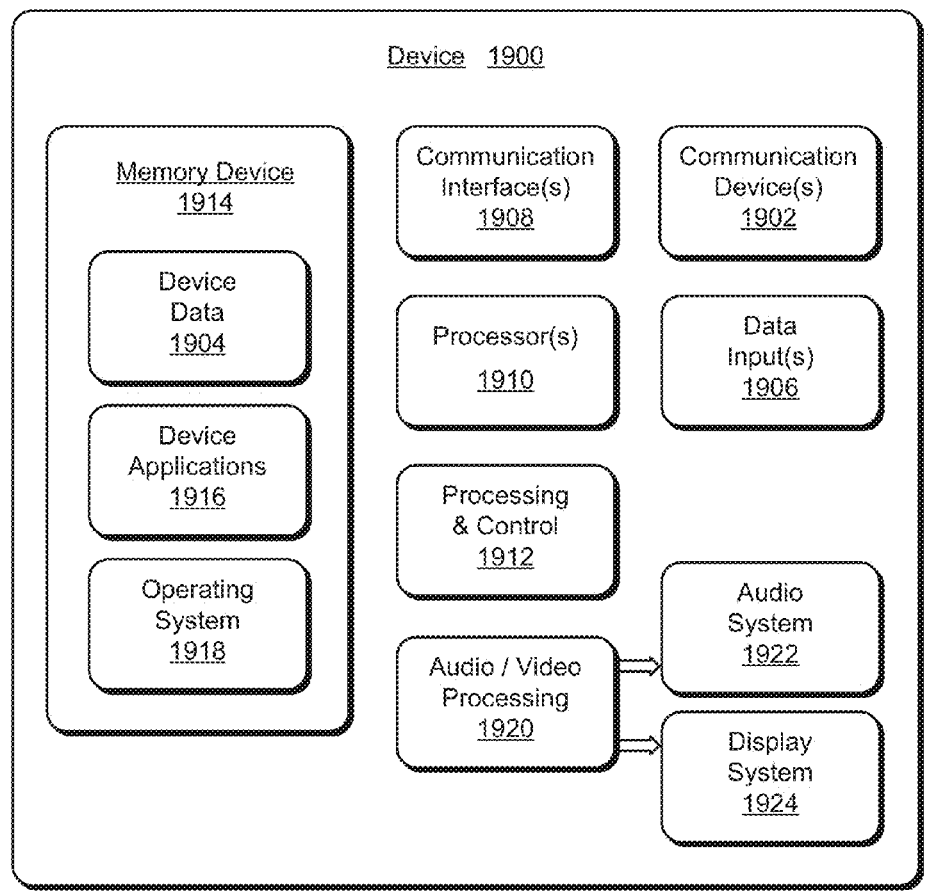
FIG. 19 illustrates various components of an example device that can implement embodiments of a high-speed I/O data system implemented with differential serializing transmitters.

FIG. 19 illustrates various components of an example device 1900 that can be implemented as any of the devices, or services implemented by devices, described with reference to the previous FIGS. 1-18. In embodiments, the device may be implemented as any one or combination of a fixed or mobile device, in any form of a consumer, computer, portable, user, communication, phone, navigation, television, appliance, gaming, media playback, and/or electronic device. The device may also be associated with a user (i.e., a person) and/or an entity that operates the device such that a device describes logical devices that include users, software, firmware, hardware, and/or a combination of devices.

The device 1900 includes communication devices 1902 that enable wired and/or wireless communication of device data 1904, such as received data, data that is being received, data scheduled for broadcast, data packets of the data, etc. The device data or other device content can include configuration settings of the device, media content stored on the device, and/or information associated with a user of the device. Media content stored on the device can include any type of audio, video, and/or image data. The device includes one or more data inputs 1906 via which any type of data, media content, and/or inputs can be received, such as user-selectable inputs and any other type of audio, video, and/or image data received from any content and/or data source.

The device 1900 also includes communication interfaces 1908, such as any one or more of a serial, parallel, network, or wireless interface. The communication interfaces provide a connection and/or communication links between the device and a communication network by which other electronic, computing, and communication devices communicate data with the device.

The device 1900 includes one or more processors 1910 (e.g., any of microprocessors, controllers, and the like) which process various computer-executable instructions to control the operation of the device. Alternatively or in addition, the device can be implemented with any one or combination of software, hardware, firmware, or fixed logic circuitry that is implemented in connection with processing and control circuits which are generally identified at 1912. Although not shown, the device can include a system bus or data transfer system that couples the various components within the device. A system bus can include any one or combination of different bus structures, such as a memory bus or memory controller, a peripheral bus, a universal serial bus, and/or a processor or local bus that utilizes any of a variety of bus architectures.

The device 1900 also includes one or more memory devices 1916 (e.g., computer-readable storage media) that enable data storage, such as random access memory (RAM), non-volatile memory (e.g., read-only memory (ROM), flash memory, etc.), and a disk storage device. A disk storage device may be implemented as any type of magnetic or optical storage device, such as a hard disk drive, a recordable and/or rewriteable disc, and the like. The device may also include a mass storage media device.

Computer readable media can be any available medium or media that is accessed by a computing device. By way of example, and not limitation, computer readable media may comprise storage media and communication media. Storage media include volatile and non-volatile, removable and non-removable media implemented in any method or technology for storage of information, such as computer-readable instructions, data structures, program modules, or other data. Storage media include, but are not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store information and which can be accessed by a computer.

Communication media typically embody computer-readable instructions, data structures, program modules, or other data in a modulated data signal, such as carrier wave or other transport mechanism. Communication media also include any information delivery media. A modulated data signal has one or more of its characteristics set or changed in such a manner as to encode information in the signal. By way of example, and not limitation, communication media include wired media such as a wired network or direct-wired connection, and wireless media such as acoustic, RF, infrared, and other wireless media.

A memory device 1914 provides data storage mechanisms to store the device data 1904, other types of information and/or data, and various device applications 1916. For example, an operating system 1918 can be maintained as a software application with the memory device and executed on the processors. The device applications may also include a device manager, such as any form of a control application, software application, signal processing and control module, code that is native to a particular device, a hardware abstraction layer for a particular device, and so on.

The device 1900 also includes an audio and/or video processing system 1920 that generates audio data for an audio system 1922 and/or generates display data for a display system 1924. The audio system and/or the display system may include any devices that process, display, and/or otherwise render audio, video, display, and/or image data. Display data and audio signals can be communicated to an audio device and/or to a display device via an RF (radio frequency) link, S-video link, composite video link, component video link, DVI (digital video interface), analog audio connection, or other similar communication link. In implementations, the audio system and/or the display system are external components to the device. Alternatively, the audio system and/or the display system are integrated components of the example device, such as an integrated touch-screen display.

Although embodiments of a high-speed I/O data system implemented with serializing transmitters have been described in language specific to features and/or methods, the subject of the appended claims is not necessarily limited to the specific features or methods described. Rather, the specific features and methods are disclosed as example implementations of a high-speed I/O data system implemented with serializing transmitters.

The invention claimed is:

1. A system, comprising:
a differential serializing transmitter configured to output non-return-to-zero (NRZ) data that is generated from pulsed data, the differential serializing transmitter comprising a first M:1 pulse-generating multiplexer configured to generate a first output as a series of intermediate pulses having a first pulse width, the first output configured as a first input to a pulse-controlled push-pull output driver; and
a first computer chip comprising a data transmitter that includes the differential serializing transmitter and a serializer configured to input data signals and multi-phase clock signals to the differential serializing transmitter.

2. The system as recited in claim 1, further comprising a second computer chip comprising a de-serializing data receiver configured to receive the NRZ data via a data channel configured to communicate the NRZ data from the first computer chip to the second computer chip.

3. The system as recited in claim 2, further comprising:
a symmetric differential serializing transmitter that is symmetric to the differential serializing transmitter on the first computer chip, the second computer chip comprising the symmetric differential serializing transmitter;
a first sideband controller configured to control and tune the differential serializing transmitter on the first computer chip; and
a second sideband controller configured to control and tune the symmetric differential serializing transmitter on the second computer chip, the first sideband controller further configured as a master controller of the second sideband controller.

4. The system as recited in claim 2, further comprising:
a first clock circuit configured to generate a transmitter forwarded-clock that is synchronous with a timing of the pulsed data to generate the NRZ data, the first computer chip comprising the first clock circuit; and
a second clock circuit configured to generate a receiver forwarded-clock that is synchronous with the timing of the pulsed data, the second computer chip comprising the second clock circuit.

5. The system as recited in claim 1, wherein the differential serializing transmitter further comprises a second M:1 pulse-generating multiplexer configured to generate a second output as a series of intermediate pulses having a second pulse width, the second output configured as a second input to the pulse-controlled push-pull output driver.

6. The system as recited in claim 5, wherein:
M equals 2;
the first 2:1 pulse-generating multiplexer includes first and second pulse generators, each configured to receive the data input signals and the multi-phase clock signals, and wherein outputs of the first and second pulse generators are coupled together; and
the second 2:1 pulse-generating multiplexer includes third and fourth pulse generators, each configured to receive the data input signals and the multi-phase clock signals, and wherein outputs of the third and fourth pulse generators are coupled together.

7. The system as recited in claim 1, wherein the differential serializing transmitter comprises two single-ended serializing transmitters that each include one or more multiplexing drive units that are each configured to generate the pulsed data derived from the input data signals and the multi-phase clock signals, each of the multiplexing drive units including the pulse-controlled push-pull output driver and the first M:1 pulse-generating multiplexer.

8. The system as recited in claim 7, wherein:
outputs of the one or more multiplexing drive units in each of the single-ended serializing transmitters are configured to be coupled together; and
a serial data signal having a data rate is generated at the coupled multiplexing drive unit outputs.

9. The system as recited in claim 1, further comprising a sideband controller configured to control at least pre-emphasis and clock phases of the multi-phase clock signals to tune the data transmitter on the first computer chip.

10. The system as recited in claim 1, further comprising:
a forwarded-clock transmitter configured to generate the multi-phase clock signals synchronous with a data clock on a data bus of the data transmitter;
an output driver configured as a source series transmitter; and
output driver transistors configured as electrostatic discharge (ESD) protection clamps for the differential serializing transmitter.

11. A method, comprising:
inputting data signals and multi-phase clock signals to a differential serializing transmitter on a first computer chip; and
generating non-return-to-zero (NRZ) data from pulsed data with the differential serializing transmitter that comprises generating a first output as a series of intermediate pulses having a first pulse width with a first M:1 pulse-generating multiplexer, the first output coupled to a first input of a pulse-controlled push-pull output driver.

12. The method as recited in claim 11, further comprising:
communicating the NRZ data via a data channel from the first computer chip to a second computer chip that receives the NRZ data with a de-serializing data receiver; and
wherein said generating the NRZ data from the pulsed data with the differential serializing transmitter further comprises generating a second output as a series of intermediate pulses having a second pulse width with a second M:1 pulse-generating multiplexer, the second output coupled to a second input of the pulse-controlled push-pull output driver.

13. The method as recited in claim 12, further comprising:
generating the pulsed data derived from the input data signals and the multi-phase clock signals with one or more multiplexing drive units, wherein:
the differential serializing transmitter comprises two single-ended serializing transmitters that each include the one or more multiplexing drive units; and
each of the multiplexing drive units including the pulse-controlled push-pull output driver and the first and second M:1 pulse-generating multiplexers.

14. The method as recited in claim 13, further comprising:
generating a serial data signal having a data rate at outputs of the one or more multiplexing drive units, the outputs of the one or more multiplexing drive units in each of the single-ended serializing transmitters being coupled together.

15. The method as recited in claim 12, wherein:
M equals 2;
the first 2:1 pulse-generating multiplexer includes first and second pulse generators, each receiving the data input signals and the multi-phase clock signals, and wherein outputs of the first and second pulse generators are coupled together; and
the second 2:1 pulse-generating multiplexer includes third and fourth pulse generators, each receiving the data input signals and the multi-phase clock signals, and wherein outputs of the third and fourth pulse generators are coupled together.

16. The method as recited in claim 11, further comprising:
tuning pre-emphasis and clock phases of the multi-phase clock signals with a sideband controller of the differential serializing transmitter; and
generating the multi-phase clock signals with a forwarded-clock transmitter, the multi-phase clocks signals generated synchronous with power supply jitter in the NRZ data.

17. A device, comprising:
a first data circuit including a differential serializing transmitter configured to generate first pulsed data, the first data circuit further including a first de-serializing data receiver configured to receive second pulsed data;
a second data circuit including a symmetric differential serializing transmitter configured to generate the second pulsed data, the second data circuit further including a symmetric de-serializing data receiver configured to receive the first pulsed data; and
a data channel configured to communicate the first pulsed data from a first computer chip that includes the first data circuit to a second computer chip that includes the second data circuit, the data channel further configured to communicate the second pulsed data from the second computer chip to the first computer chip.

18. The device as recited in claim 17, wherein:
the symmetric differential serializing transmitter on the second computer chip is symmetric to the differential serializing transmitter on the first computer chip;
the symmetric de-serializing data receiver on the second computer chip is symmetric to the de-serializing data receiver on the first computer chip; and
the differential serializing transmitter and the symmetric differential serializing transmitter each comprising a first M:1 pulse-generating multiplexer configured to generate a first output as a series of intermediate pulses having a first pulse width, the first output configured as a first input to a pulse-controlled push-pull output driver.

19. The device as recited in claim 18, wherein the differential serializing transmitter and the symmetric differential serializing transmitter each further comprise a second M:1 pulse-generating multiplexer configured to generate a second output as a series of intermediate pulses having a second pulse width, the second output configured as a second input to the pulse-controlled push-pull output driver.

20. The device as recited in claim 19, further comprising:
a first output driver configured as a first source series transmitter that outputs the first pulsed data;
a second output driver configured as a second source series transmitter that outputs the second pulsed data; and
the differential serializing transmitter and the symmetric differential serializing transmitter each comprising two single-ended serializing transmitters that each include one or more multiplexing drive units that are each configured to generate the first and second pulsed data, each of the multiplexing drive units including the pulse-controlled push-pull output driver and the first and second M:1 pulse-generating multiplexers.

* * * * *